United States Patent [19]

Yamazaki et al.

[11] Patent Number: 5,751,655
[45] Date of Patent: May 12, 1998

[54] SYNCHRONOUS TYPE SEMICONDUCTOR MEMORY DEVICE HAVING INTERNAL OPERATION TIMINGS DETERMINED BY COUNT VALUES OF AN INTERNAL COUNTER

[75] Inventors: Akira Yamazaki; Katsumi Dosaka, both of Hyogo, Japan

[73] Assignee: Mitsubishi Denki Kabushiki Kaisha, Tokyo, Japan

[21] Appl. No.: 788,803

[22] Filed: Jan. 23, 1997

[30] Foreign Application Priority Data

Apr. 22, 1996 [JP] Japan .................................. 8-100123

[51] Int. Cl.$^6$ ...................................... G11C 8/00
[52] U.S. Cl. ...................... 365/233; 365/222; 365/236
[58] Field of Search ................................ 365/233, 236, 365/222

[56] References Cited

U.S. PATENT DOCUMENTS

| | | | |
|---|---|---|---|
| 5,339,344 | 8/1994 | Kimura et al. | 377/39 |
| 5,349,562 | 9/1994 | Tanizaki | 365/222 |
| 5,396,259 | 3/1995 | Pang et al. | 345/34 |
| 5,477,491 | 12/1995 | Shirai | 365/194 |
| 5,535,169 | 7/1996 | Endo et al. | 365/230.03 |
| 5,581,512 | 12/1996 | Kitamura | 365/233 |

FOREIGN PATENT DOCUMENTS 5-143445  6/1993  Japan.

*Primary Examiner*—David C. Nelms
*Assistant Examiner*—Hoai V. Ho
*Attorney, Agent, or Firm*—Lowe, Price, LeBlanc & Becker

[57] ABSTRACT

A memory includes a counter by an operation mode designating command for counting a clock signal, and a circuit for generating an internal operation timing control signal according to the count value of the counter. Activation/inactivation of an internal operation control signal is done in synchronization with a clock signal. It is not necessary to take into consideration the margin with respect to an internal operation control signal. High speed operation can be carried out stably. By providing a signal indicating an internal operation state according to the count value of the counter, the load of an external memory controller for monitoring a command issue timing can be reduced. A high speed operating memory is provided that can reduce the load of a memory controller and that can set the internal operation timing accurately.

11 Claims, 24 Drawing Sheets

VALUES IN ELLIPSOID PERRESENT FF1<4> - FF1<0> FROM LEFT

FIG. 30 PRIOR ART
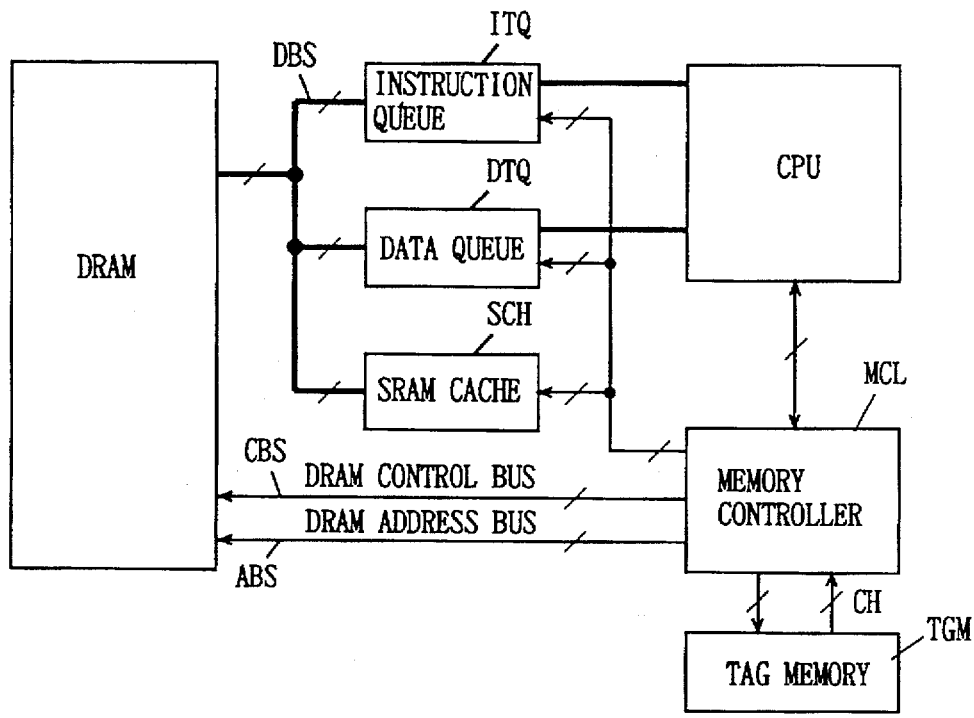
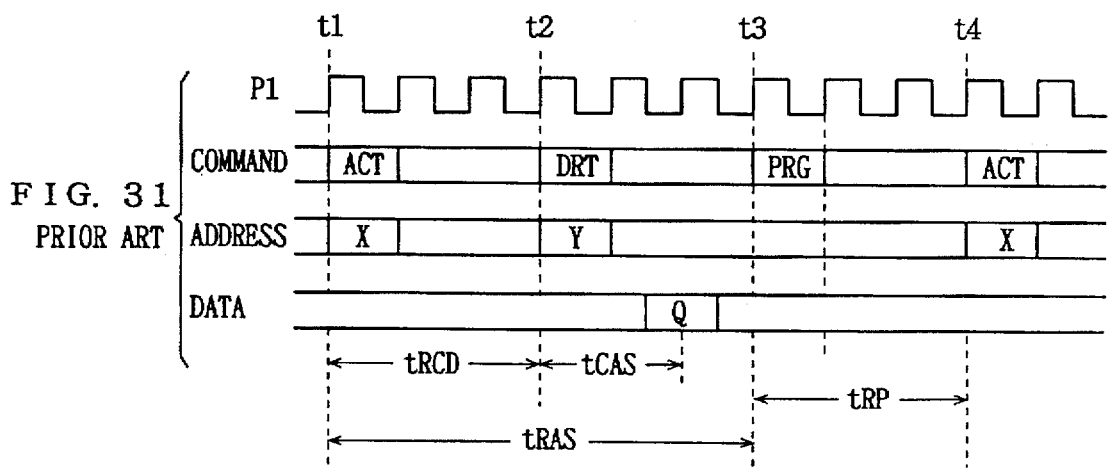
FIG. 31 PRIOR ART

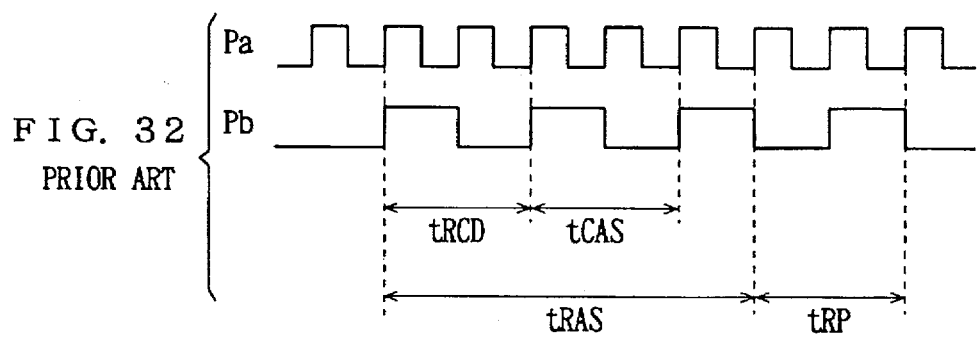
FIG. 32 PRIOR ART
FIG. 33 PRIOR ART
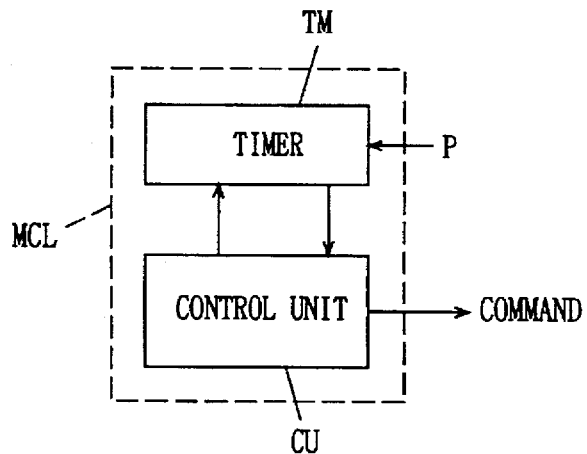
FIG. 34 PRIOR ART
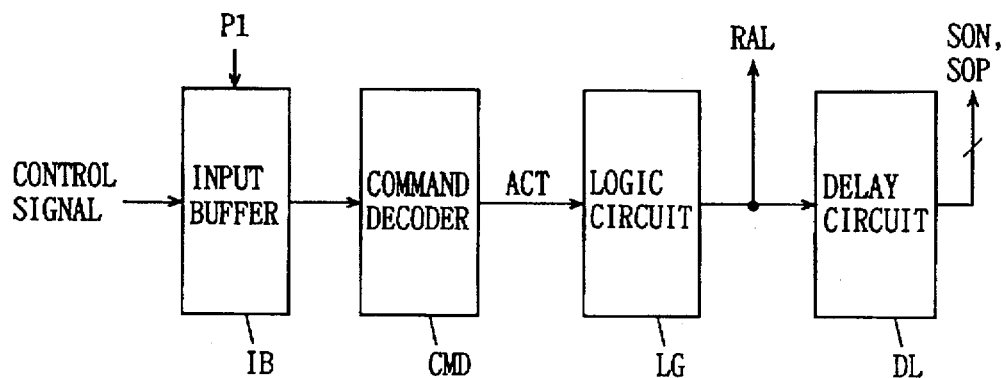

SYNCHRONOUS TYPE SEMICONDUCTOR MEMORY DEVICE HAVING INTERNAL OPERATION TIMINGS DETERMINED BY COUNT VALUES OF AN INTERNAL COUNTER

BACKGROUND OF THE INVENTION

1. Field of the Invention

The present invention relates to semiconductor memory devices, and particularly to a synchronous type semiconductor memory device operating in synchronization with a clock signal periodically applied repeatedly. More particularly, the present invention relates to a synchronous type semiconductor memory device integrated with a processor on a common semiconductor chip.

2. Description of the Background Art

FIG. 30 schematically shows an entire structure of an integrated semiconductor device having a conventional dynamic random access memory (referred to as DRAM hereinafter) and a processor (referred to as CPU hereinafter) formed on the same semiconductor chip. Referring to FIG. 30, the integrated semiconductor device includes an instruction queue ITQ for enqueuing and storing instructions for the CPU, a data queue DTQ for enqueuing and storing data for the CPU, an SRAM (Static Random Access Memory) cache SCH for storing data to be stored into instruction queue ITQ and data queue DTQ and data required to be accessed by the CPU, a tag memory TGM for storing an address that is most recently accessed in each tag of data stored in SRAM cache SCH, and a memory controller MCL for controlling operations of the DRAM, instruction queue ITQ, data queue DTQ and SRAM cache SCH.

Instruction queue ITQ and data queue DTQ can enqueue and store instructions and data from SRAM cache SCH or the DRAM so that an instruction and data required by the CPU can be prefetched. Therefore, the access time to SRAM cache SCH can be reduced to allow high speed processing. Memory controller MCL transfers an instruction and data stored in SRAM cache SCH to respective instruction queue ITQ and data queue DTQ according to an access request from the CPU.

Where there is an access request from the CPU, memory controller MCL refers to tag memory TGM to compare the tag of the access-requested address by the CPU with the address of a corresponding tag stored in tag memory TGM. When the tag addresses match, it is determined that the access-requested data/instruction is stored in SRAM cache SCH, and data is transferred from SRAM cache SCH to instruction queue ITQ, and data queue DTQ. When it is determined that the data to be accessed by the CPU is not stored in SRAM cache SCH (the case of cache miss) as a result of reference to tag memory TGM, memory controller MCL accesses the DRAM via a DRAM control bus CBS and a DRAM address bus ABS, and the data/instruction required by the CPU is transferred to SRAM cache SCH, instruction queue ITQ and data queue DTQ. The CPU provides a flag indicating whether an instruction or data is required to memory controller MCL. The DRAM is connected to SRAM cache SCH, data queue DTQ and instruction queue ITQ by a data bus DBS to allow data transfer therebetween.

By integrating the DRAM and the CPU on the same semiconductor chip, data transfer from the DRAM to SRAM cache SCH, instruction queue ITQ and data queue DTQ is executed via internal data bus DBS. The band width of data transfer (data transfer rate) is determined depending upon the bit width of internal data bus DBS. Therefore, data transfer can be carried out at high speed without the input and output pin terminals of the DRAM becoming the bottleneck to data transfer.

FIG. 31 is a timing chart of a data readout operation of the DRAM.

The DRAM reads in a control signal and inputs/outputs data in synchronization with a clock signal P1 which is the system clock in this integrated semiconductor device. The operation mode instruction is provided in the form of a command which is a combination of the status of a plurality of control signals.

At time t1, an active command ACT is applied together with an address X. Active command ACT indicates activation, i.e. initiation of a word line select operation in the DRAM. In response to an apply of this active command ACT, the DRAM drives a corresponding row (word line) according to applied address X to a selected state.

At time t2, a read command DRT is applied to specify a data readout operation. The DRAM carries out a column select operation according to read command DRT and an applied address Y to provide data on the selected column. Data Q read out from the DRAM is sampled according to clock signal P1. Therefore, data Q attains an ascertained state at one edge (a rising edge in FIG. 31) of clock signal P1.

At time T3, a precharge command PRG is applied. The selected array of the DRAM is driven to an inactive state to return to a precharge state.

At time t4, active command ACT is applied again, whereby an array activation operation (word line select operation) according to a currently applied address X is carried out.

By sending and receiving signal/data in synchronization with clock signal P1 at an interface unit for interfacing to an outside, the internal operation timing margin for a skew of a control signal in the DRAM does not have to be accounted for. The internal operation initiating timing can be made faster to allow high speed access. This is because sampling of a command and address are carried out at one edge (a rising edge) of clock signal P1.

In the DRAM, a time period referred to as RAS-CAS delay time tRCD is required for a period starting from a row select operation in response to an active command until a read command DRT or a write command DWT (a command indicating data write operation) is applied. This delay time corresponds to the time required for data of a memory cell in a selected row in the array to be sensed and amplified and then latched by a sense amplifier not shown in a row select operation.

Also, a time period called CAS latency (or CAS access time) is required for a period starting from application of a read command DRT or write command DWT until data Q is read out. In a synchronous type semiconductor memory device, the CAS latency is represented by the number of clock cycles required for output of valid data from application of a read command/write command (the CAS latency is 2 in FIG. 31).

A time period referred to as RAS active time tRAS is required for a period starting from application of active command ACT up to application of a precharge command PRG. This is because time is required in the DRAM starting from data of a selected memory cell to be sensed and amplified and latched until rewriting of data into the selected memory cell by the sense amplifier. If precharge command PRG is applied prior to elapse of this RAS active time tRAS, the operation of a selected row is interrupted, whereby data of the selected memory cell is lost.

Furthermore, a time period called RAS precharge time tPR is required for a period starting from application of precharge command PRG at time t3 of FIG. 31 until application of active command ATC. This time is required for the DRAM to be internally restored to a precharge state reliably. The time periods of tRCD, tRAS, and tRP are all defined as specifications.

A case is considered where an operation clock frequency of the DRAM built-in processor is altered. As shown in FIG. 32, the respective number of clock cycles of RAS-CAS delay time tRCD, CAS latency tCAS, RAS active time tRAS and RAS precharge time tRP differ between the cases of operating in synchronization with a high speed clock signal Pa and with a low speed clock signal Pb. For example, RAS-CAS delay time tRCD is two clock cycle in the case of clock signal Pa and one clock cycles in the case of clock signal Pb.

Conventionally, memory controller MCL adjusts the generation timing of various commands according to a count value of a timer TM counting clock signal P as shown in FIG. 33. In this case, control unit CU must modify the generation timing of a command according to the operating frequency of each clock signal P. The load thereof is great and the control is complex. This is because there is necessity to modify the count value of timer TM (for command issue) in conformity to the frequency of each clock signal.

Although the latching of an externally supplied signal is carried in synchronization with clock signal P1 in the DRAM, the internal operation is carried out asynchronously to clock signal P1. More specifically, as shown in FIG. 34, input buffer IB takes in an external control signal in synchronization with clock signal P1 for provision to command decoder CMD. Command decoder CMD determines the combination of the status of the control signal applied from input buffer IB to generate an internal operation specifying signal. FIG. 34 shows the state when active signal ACT is generated.

A logic circuit LG generates an internal control signal according to a command signal ACT provided from command decoder CMD. In FIG. 34, a row address latch designating signal RAL is shown. In response to row address latch designating signal RAL, a row address buffer temporarily attains a through state, and then attains a latching state. By delaying the output signal of logic circuit LG by a predetermined time through a delay circuit DL, an internal operation control signal is generated. In FIG. 34, signals SON and SOP for activating a sense amplifier are shown. Other signals associated with word line selection are generated likewise from delay circuit DL. Logic circuit LG and delay circuit DL are generally formed using a logic gate and an inverter to operate in asynchronization with clock signal P1. Therefore, the operation characteristics of logic circuit LG and delay circuit DL differ with variation of the operating environment (operating temperature, power supply voltage), whereby the transition timing of internal operation control signals RAL, SON and SOP to an active state is altered. It is therefore necessary to ensure margin for the control signals internally for determining the internal operation timing, causing a problem that high speed operation cannot be realized.

The above-described problem is encountered, not only in a DRAM-incorporated processor, but also in a general clock synchronous type semiconductor device operating in synchronization with a clock signal.

SUMMARY OF THE INVENTION

An object of the present invention is to provide a synchronous type semiconductor memory device that has load of a memory controller reduced even when clock signal frequency is modified.

Another object of the present invention is to provide a synchronous type semiconductor device that operates speedily and stably independent of variation in operating environment.

A further object of the present invention is to provide a synchronous type semiconductor memory device that can have generation timing of an internal control signal modified readily according to a clock signal frequency for operating at an optimum operation timing to realize high speed access.

A semiconductor memory device according to the present invention includes a counter started in response to an operation mode designating signal for counting a periodically applied clock signal, and a control signal generation circuit for generating an internal operation control signal associated with row or column selection according to a count value from the counter.

By generating all internal control signals in synchronization with a clock signal in a semiconductor memory device, the internal operation is carried out in synchronization with a clock signal and the internal operation timing margin does not have to be considered. The operation mode designating signal generation timing can be adjusted by modification of a logic circuit even when the clock signal frequency is altered, so that the semiconductor memory device can be operated properly at high speed.

By providing a signal that inhibits application of a row/column related command to the outside world according to a count value of clock signals, an external memory controller can identify the output timing of a command without counting the clock signal. The load of the memory controller for generating a command (signal) is reduced, and designing thereof is facilitated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 schematically shows an entire structure of a conventional DRAM incorporated processor.

FIG. 31 is a timing chart representing an operation of the DRAM incorporated processor of FIG. 30.

FIG. 32 is a diagram for describing problems of a conventional DRAM incorporated processor.

FIG. 33 schematically shows a structure of a conventional memory controller.

FIG. 34 is a diagram for describing problems of a conventional DRAM.

DESCRIPTION OF THE PREFERRED EMBODIMENTS

Figure 1:
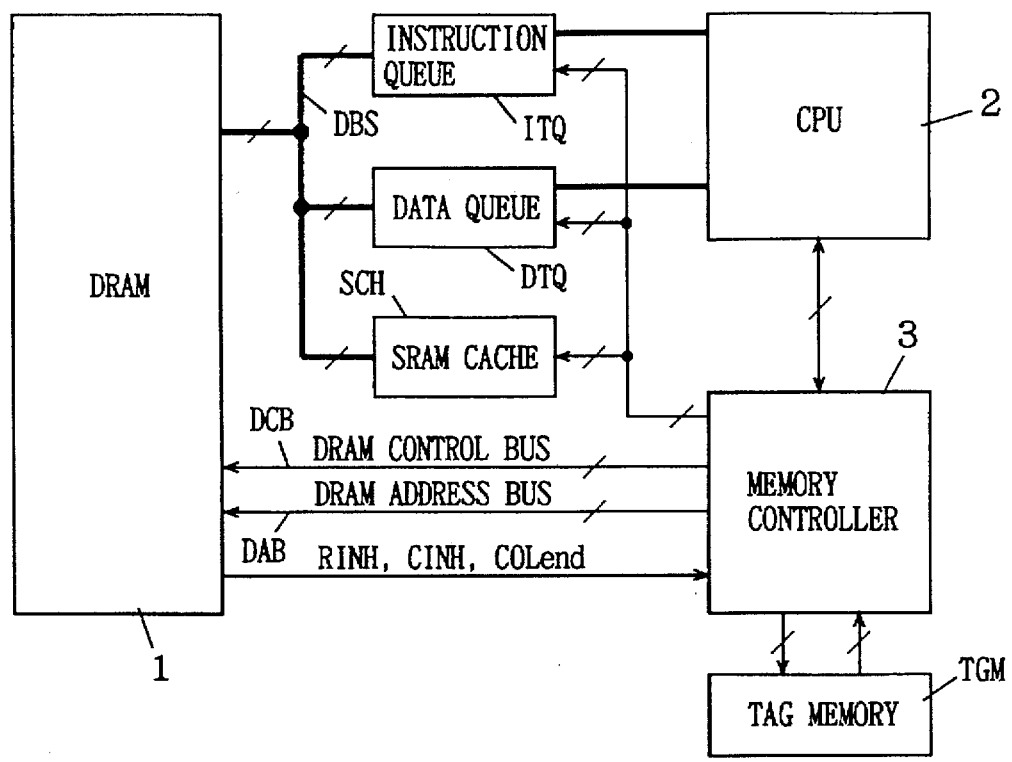
FIG. 1 schematically shows an entire structure of a DRAM incorporated processor according to the present invention.

Referring to FIG. 1, a DRAM-incorporated processor includes a DRAM 1 functioning as a main memory, a processor (CPU)2 for carrying out operational processing according to data/instruction stored in DRAM 1 and a memory controller 3 for controlling data transfer between processor (CPU)2 and DRAM 1.

The DRAM-incorporated processor further includes an SRAM cache SCH for storing data requested by processor CPU 2 out of the data stored in DRAM 1 as cache in advance, an instruction queue ITQ and a data queue DTQ for enqueuing and storing an instruction and data, respectively, requested by processor (CPU)2, and a tag memory TGM for storing the address of respective tags of data stored in SRAM cache SCH. When access to DRAM 1 is required, memory controller 3 applies a command (control signal) and an address via a DRAM control bus DCB and a DRAM address bus DAB. The control signal applied from memory controller 3 to DRAM 1 may be in the form of a command, or a command decoded in memory controller 3 to be applied as an operation mode designating signal.

When access is requested, DRAM 1 provides a row related command inhibit signal RINH inhibiting application of a command associated with a row select operation, a column related command inhibit signal CINH inhibiting application of a command associated with a column select operation, and a column operation complete signal COLend to memory controller 3. When row related command inhibit signal RINH and column related command inhibit signal CINH are rendered inactive, memory controller 3 provides respective row related command and column related command to DRAM 1. Column operation complete signal COLend indicates that available valid data is output from DRAM 1 and a column select operation is completely completed to allow input of a subsequent command. The application of row related command inhibit signal RINH, column related command inhibit signal CINH, and column operation complete signal COLend to memory controller 3 from DRAM 1 in response to an access request from memory controller 3 allows memory controller 3 to access DRAM 1 in the so-called "hand shake" system. Memory controller 3 does not have to internally monitor the output timing of each command corresponding to the operating frequency of the clock signal. Therefore, the load thereof is reduced.

[First Embodiment]

Figure 2:
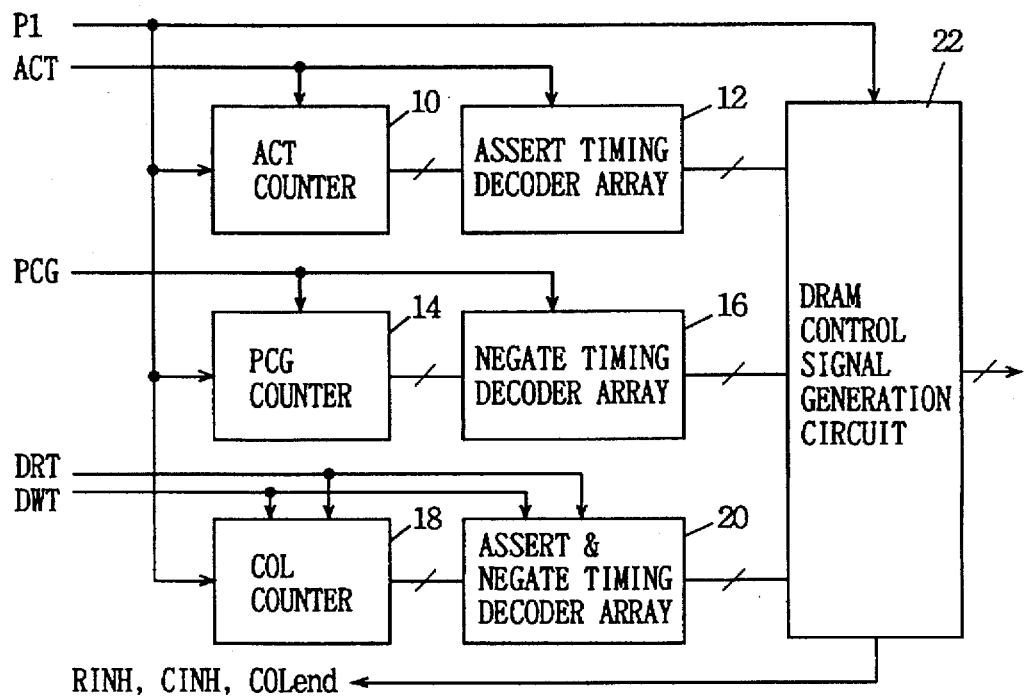
FIG. 2 is a block diagram schematically showing a structure of a control unit of the DRAM of FIG. 1.

FIG. 2 is a block diagram schematically showing a structure of an internal operation control signal generation unit of DRAM 1 of FIG. 1. Referring to FIG. 2, DRAM 1 includes an ACT counter 10 started upon activation of active signal ACT for counting a clock signal P1, an assert timing decoder array 12 for decoding a count value of ACT counter 10 to determine an assert timing (activation timing) of an internal operation control signal of DRAM 1 according to the decoded result, a PCG counter 14 started in response to activation of a precharge designating signal PCG for counting clock signal P1, a negate timing decoder array 16 for decoding an output count value of PCG counter 14 to generate a signal determining the inactivation timing of an internal operation control signal according to the decoded result, a COL counter 18 started in response to one of a read out operation designating signal DRT and write operation designating signal DWT for counting clock signal P1, an assert/negate timing decoder array 20 activated in response to one of readout operation designating signal DRT and write operation designating signal DWT for decoding a count value from COL counter 18 to determine the assert/negate timing of an operation control signal associated with data writing/reading thereof, and a DRAM control signal generation circuit 22 for activating/inactivating a DRAM internal operation control signal according to output signals of decoder arrays 12, 16 and 20.

Assert timing decoder array 12 provides the activation timing of an array of DRAM 1, i.e. activation of a control signal of the portion associated with a row (word line) select operation. Negate timing decoder array 16 provides the timing for completing a DRAM row select operation.

Clock signal P1 is used as a system clock signal in FIG. 1. As for array activation designating signal ACT, precharge designating signal PCG, readout operation designating signal DRT and write operation designating signal DWT, they may be applied from memory controller 3, or the memory controller 3 applies a command, and DRAM 1 decodes the command to generate them. DRAM 1 and memory controller 3 are formed on the same semiconductor chip, and there is no particular difference in which of DRAM 1 or memory controller 3 includes the command decoder. In the following description, it is assumed that the command decoder is provided in memory controller 3, and control signals ACT, PCG, DRT, and DWT are output from memory controller 3.

DRAM control signal generation circuit 22 generates and externally provides (to memory controller) a row related command inhibit signal RINH, a column related command inhibit signal CINH, and a column operation complete signal COLend according to output signals from decoder array 12, 16 and 20.

As shown in FIG. 2, the active/inactive (assert/negate) timing of all internal operation control signals is determined by the count value of clock signal P1. All the internal operation timing can be determined in synchronization with the clock signal. It is not necessary to consider the operation timing margin, and high speed access is allowed. By generating row related command inhibit signal RINH, column related command inhibit signal CINH, and column operation complete signal COLend according to the clock count, memory controller 3 can easily determine a command issue timing. Column operation complete signal COLend is rendered active after completion of a column select operation to indicate that valid data is output on data bus DBS (refer to FIG. 1) and that input of the next command is allowed. Specific structures of each component will be described hereinafter.

Figure 3:
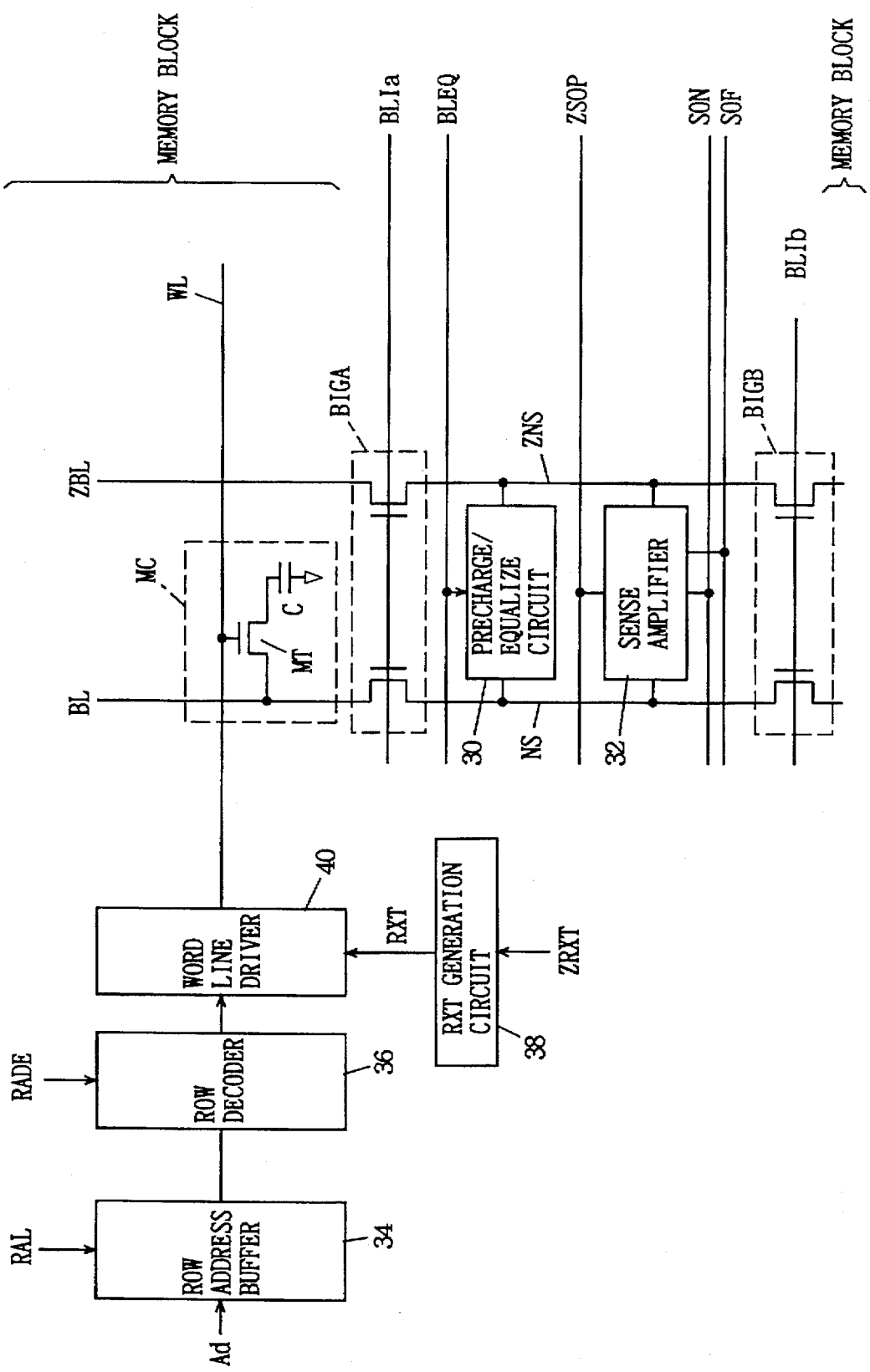
FIG. 3 schematically shows the circuitry portion operating according to a row related control signal of the DRAM of FIG. 1.

FIG. 3 shows the structure of circuitry operating in response to an array activation designating signal (referred to simply as "active signal" hereinafter) ACT and an array precharge operation designating signal (referred to simply as "precharge signal" hereinafter) PCG. The structure of FIG. 3 is generally called "row related circuitry". In FIG. 3, only one memory block of a plurality of memory blocks included in DRAM 1 is representatively shown. Memory cells MC are arranged in a matrix of rows and columns in a memory block. A word line WL is disposed corresponding to each row of memory cells MC. Bit lines BL and ZBL are disposed corresponding to each column of memory cells MC. A memory cell MC includes a capacitor C for storing information, and a memory transistor MT rendered conductive in response to a signal potential on a corresponding word line WL for connecting capacitor C to a corresponding bit line BL (or ZBL). Bit lines BL and ZBL form a pair to transmit data signals complementary to each other.

A precharge/equalize circuit 30 and a sense amplifier 32 are provided to bit line pair BL and ZBL. Precharge/equalize circuit 30 and sense amplifier 32 are disposed corresponding to each column (bit line pair BL and ZBL) of two adjacent memory blocks. Precharge/equalize circuit 30 responds to a bit line equalized designating signal BLEQ for precharging nodes NS and ZNS to a predetermined potential (intermediate potential VBL) and electrically short-circuiting these nodes NS and ZNS.

Sense amplifier 32 is activated in response to sense amplifier activation signals ZSOP, SON and SOF for amplifying differentially the potentials of nodes NS and ZNS. Sense amplifier 32 includes cross-coupled p channel MOS transistors activated upon activation of sense amplifier activation signal ZSOP for driving a node at the higher potential out of nodes NS and ZNS to a power supply voltage level, and cross-coupled n channel MOS transistors activated in response to sense amplifier activation signals SON and SOF for discharging a node of the lower potential out of nodes NS and ZNS to the level of ground potential. Sense amplifier activation signal SOF is activated at a timing faster than sense amplifier activation signal SON to operate sense amplifier 32 at a relatively low sensing rate. In contrast, sense amplifier activation signal SON operates sense amplifier 32 at a high sensing rate. The potential difference of nodes NS and ZNS gradually increases by a sense amplifier activation signal SOF, which is further increased speedily according to sense amplifier activation signal SON. Thus, a small potential difference is amplified stably and at high speed.

A bit line isolation gate BIGA is provided between nodes NS and ZNS and bit lines BL and ZBL, rendered conductive in response to a bit line isolation designating signal BLIa for coupling bit lines BL and ZBL with nodes NS and ZNS. A bit line isolation gate BIGB is provided between another memory block not shown and nodes NS and ZNS, rendered conductive in response to a bit line isolation designating signal BLIb for connecting nodes NS and ZNS to corresponding bit lines of the memory block not shown. In a standby state (precharge state: array inactivation state), bit line isolation designating signals BLIa and BLIb both attain an active state of an H level (logical high), and bit line isolation gates BIGA and BIGB both conduct, and nodes NS and ZNS are connected to corresponding columns (bit line pairs) of adjacent memory blocks. In a standby state, bit line equalize designating signal BLEQ attains an active state of an H level, so that precharge/equalize circuit 30 precharges and equalize nodes NS and ZNS to an intermediate potential level. Therefore, corresponding bit lines BL and ZBL are also precharged to the intermediate potential level. Bit line isolation gates BIGA and BIGB, precharge/equalize circuit 30, and sense amplifier 32 form the row related circuitry.

The row related circuitry further includes a row address buffer 34 responsive to a row address latch designating signal RAL for latching an applied address signal Ad and generating an internal row address signal, a row decoder 36 activated in response to a row address decode enable signal RADE for decoding complementary address signals generated from the internal address signal applied from row address buffer 34 to generate a word line select signal, an RXT generation circuit 38 activated in response to a word line activation timing designating signal ZRXT for generating a word line drive signal RXT of a high voltage VPP level, and a word line driver 40 for transmitting a word line drive signal RXT of high voltage VPP level on a selected (addressed) word line WL according to a word line select signal from row decoder 36 and a word line drive signal RXT from RXT generation circuit 38.

Row decoder 36 has a predecoder/row decoder configuration. A plurality of word lines are selected simultaneously by a predecode signal. Word line drive signal RXT is transmitted according to the decode signal to one of the plurality of word lines selected simultaneously. Word line driving signal RXT is logically gated with the output signal (decode signal) of row decoder 36 to be applied to each word line driver 40.

Figure 4:
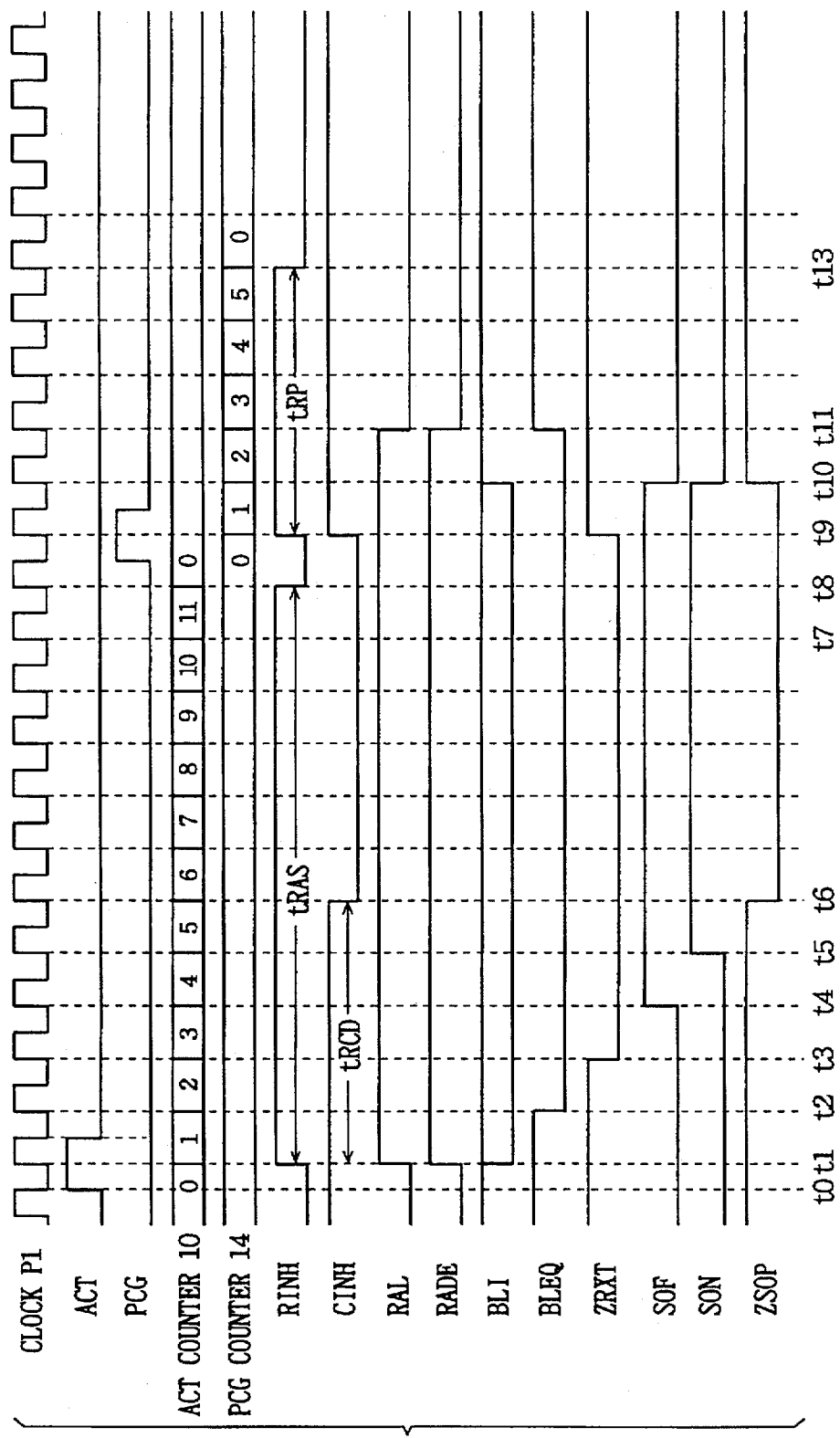
FIG. 4 is a timing chart showing the generation sequence of a row related control signal of a DRAM control signal generation circuit of FIG. 2.

FIG. 4 is a timing chart indicating the generation sequence of an internal control signal for driving the row related circuitry of FIG. 3. The internal control signal for driving the row related circuitry shown in FIG. 4 are provided from DRAM control signal generation circuit 22 according to output signals from ACT counter 10, assert timing decoder array 12, PCG counter 14 and negate timing decoder array 16 of FIG. 2. The generation operation sequence of an internal control signal for driving the row related circuitry will be described with reference to FIGS. 2–4.

Prior to time t0, ACT counter 10 and PCT counter 14 have their count values reset to 0. When active signal ACT is rendered active in synchronization with a fall of clock signal P1 at time t0, ACT counter 10 effects a count operation in response to a rise of next clock signal P1 to increment the count value by 1.

When the count value of ACT counter 10 becomes 1 at time t1, DRAM control signal generation circuit 22 drives row related command inhibit signal RINH to an H level of an active state, and row address latch designating signal RAL and row address decode enable signal RADE to an active state of an H level according to an output signal from assert timing decoder array 12. In response, row address buffer 34 latches an applied address signal Ad to generate an internal address signal. Also, row decoder 36 initiates a decoding operation. In response to inactivation of bit line isolation designating signal BLI, the memory block paired with the selected memory block is isolated from corresponding sense amplifier nodes NS and ZNS. Here, bit line equalize designating signal BLEQ attains an active state of an H level. Precharge/equalize circuit 30 effects an equalize operation to precharge each column of the corresponding memory block to an intermediate potential.

At time t2, clock signal P1 is pulled up to an H level, and the count value of ACT counter 10 is incremented by 1. In response, bit line equalize designating signal BLEQ (corresponding to a selected memory block) is rendered inactive of an L level. Each precharge/equalize circuit 30 is rendered inactive, whereby the precharge operation of nodes NS and ZNS is inhibited. At time t1, the bit line isolation designating signal corresponding to the non-selected memory block forming a pair with the selected memory block is also rendered inactive according to the block designating signal included in the applied address signal. The selected memory block is connected to a corresponding sense amplifier. The non-selected memory block paired with this selected memory block is cut off from the sense amplifier circuit. When both the memory blocks sharing the sense amplifier are in a non-selected state, the non-selected memory blocks are both connected to the sense amplifier circuit.

At time t3, clock signal P1 rises again to an H level, and the counter value of ACT counter 10 is increased by one to become 3. In response to the count value of 3, word line drive timing signal ZRXT is rendered active of an L level (logical low) to activate RXT generation circuit 38, whereby word line drive signal RXT is rendered active. This word line drive signal RXT of an active state is transmitted on a selected word line WL via word line driver 40 in response to a word line select signal generated by row decoder 36.

At time t4 when clock signal P1 rises to an H level again, the count value of ACT counter 10 is incremented by one, and sense amplifier activation signal SOF is rendered active of an H level. In response, sense amplifier 32 is activated to gradually amplify the potential difference of nodes NS and ZNS. Here, sense amplifier activation signal SOF renders active only the sense amplifiers corresponding to the selected memory cells. This is implemented by taking the logical product of the memory block designating signal and sense amplifier activation signal SOF.

At time t5, clock signal P1 rises to an H level, and the count value of ACT counter becomes 5, whereby sense amplifier activation signal SON is driven to an H level of an active state. Accordingly, sense amplifier 32 operates at high speed, so that the lower potential node out of nodes NS and ZNS are discharged at high speed to the level of the ground potential.

At time t6, clock signal P1 rises to an H level, and sense amplifier activation signal ZSOP is rendered active of an L level, whereby sense amplifier 32 drives the higher potential node out of nodes NS and ZNS to the level of power supply voltage. At this time t6, column related command inhibit signal CINH attaining an active state of an H level is pulled down to an L level to permit input of a column related command. The period from time t1 to time t6 corresponds to RAS-CAS delay time tRCD. At time t6 onward, a column related command that will be described afterwards is applied to effect a column select operation.

At time t7, clock signal P1 rises to an H level, and the count value of ACT counter 10 becomes 11. At time t8, clock signal P1 rises to an H level. The count value of ATC counter 10 is reset to 0 from 11, whereby row related command inhibit signal RINH is rendered inactive of an L level. As a result, input of a row related command is permitted. This period from time t1 to time t8 is defined as RAS active time tRAS. Time tRAS is the time required for a period starting from an application of an active command, followed by selection of a word line, operation of the sense amplifier until the data of the memory cell amplified by the sense amplifier is written again into the memory cell.

After time t8, precharge signal PCG is driven to an H level of an active state in response to a fall of clock signal P1. At time t9, the count value of PCG counter 14 is incremented from 0 to 1. In response to the count value of PCG counter 14, row related command inhibit signal RINH is rendered active of an H level to inhibit input of a row related command. When the count value of PCG counter 14 becomes 1, column related command inhibit signal CINH is driven to an H level to inhibit input of a column related command. When the count value of PCG counter 14 becomes 1, word line drive timing designing signal ZRXT is rendered inactive at an H level. Word line drive signal RAX transmitted to a selected word line is driven to an L level to cause the selected word line into a de-selected state.

At time T10, clock signal P1 rises to an H level, and the count value of PCG counter 14 is incremented by 1 to become 2. In response, bit line isolation designating signal BLI is driven to an H level, whereby the isolated memory block is connected to a corresponding sense amplifier. Sense amplifier activation signals SOF and SON are both rendered inactive of at an L level, and sense amplifier activating signal ZSOP is rendered inactive at an L level.

At time t11, clock signal P1 rises, and the count value of PCG counter 14 is incremented to 3. Row address latch designating signal RAL and row address decode enable signal RADE are rendered inactive at an L level, whereby row address buffer 34 is released from its latching state. Row decoder 36 has its decoding operation inhibited (generation of complementary internal address signals and a decoding operation thereof are inhibited).

As a result, the row related circuitry of DRAM 1 returns to a standby state (precharge state).

At time t12, clock signal P1 rises to an H level, and the count value of PCG counter 14 is reset to 0. When the count value of PCG counter 14 becomes 0, row related command inhibit signal RINH is rendered inactive again at an L level to permit input of a row related command. The period from time t9 to time t13 corresponds to RAS precharge period tRP. The internal signal line and nodes are restored to a predetermined precharge potential during this period.

By rendering the control signal for operating each circuit portion active/inactive in synchronization with clock signal P1, it is not necessary to consider the timing margins of these control signals, and an internal operation (row select/deselect: array activation/inactivation) can be effected at high speed. Since a control signal is generated in synchronization with clock signal P1, an internal control signal is generated at a proper timing according to clock signal P1 even when the operating environment is varied. This prevents operation according to an unstable signal, and a DRAM that operates stably and at high speed can be realized.

Figure 5:
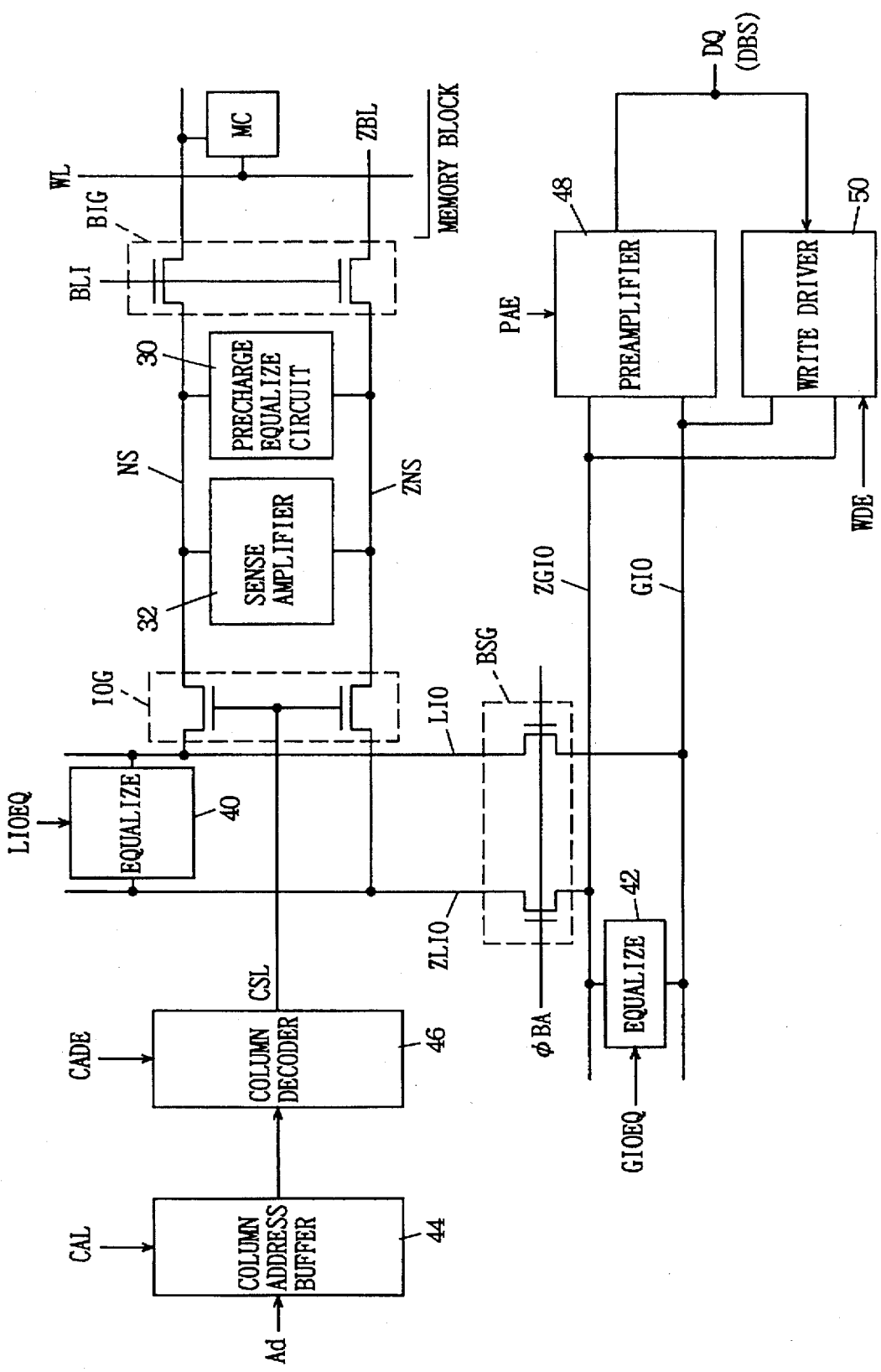
FIG. 5 schematically shows the circuitry portion operating according to a column related control signal of the DRAM of FIG. 1.

FIG. 5 schematically shows a structure of column related circuitry of DRAM 1. Precharge/equalize circuit 30 and sense amplifier 32 are similar to those shown in FIG. 3. Only a bit line isolation gate BIG corresponding to one memory block is representatively shown for bit line isolation gates. In this DRAM 1, local IO lines LIO and ZLIO are provided corresponding to respective memory blocks (in a sense amplifier group in a shared sense amplifier structure), and global IO lines GIO and ZGIO are provided in common to the plurality of memory blocks.

The column related circuitry includes a bit line select gate IOG provided corresponding to bit lines BL and ZBL, rendered conductive in response to a column select signal CSL from a column decoder that will be described afterwards for connecting corresponding bit lines BL and ZBL (sense nodes NS and ZNS) to local IO lines LIO and ZLIO, a block select gate BSG rendered conductive in response to a block select signal φBA for connecting local IO lines LIO and ZLIO to global IO lines GIO and ZGIO, an equalize circuit 40 activated in response to a local IO line equalize designating signal LIOEQ for equalizing the potentials of local IO lines LIO and ZLIO to a predetermined potential (intermediate potential level), and a global IO line equalize circuit 42 activated in response to a global IO line equalize designating signal GIOEQ for precharging and equalizing the potentials of global IO lines GIO and ZGIO to a predetermined level (normally, power supply voltage level). Signal φBA for controlling conduction/non-conduction of memory block select gate BSG is rendered active in synchronization with activation of local IO line equalize signal LIOEQ (or global IO line equalize designating signal GIOEQ).

The column related circuitry further includes a column address buffer 44 responsive to a column address latch designating signal CAL for taking in and latching an address signal Ad to generate an internal column address signal, a column decoder 46 activated in response to a column address decode enable signal CADE for generating and decoding complementary internal column address signals from the internal column address signal applied from column address buffer 44 to drive column select signal CSL corresponding to an addressed column (bit line pair) to an active state, a preamplifier 48 activated in response to a preamplifier enable signal PAE for amplifying differentially the potentials on global IO lines GIO and ZGIO, and a write driver 54 activated in response to a write driver enable signal WDE for generating complementary internal write data from the applied written data to transmit the complementary internal write data onto global IO lines GIO and ZGIO.

When a read command is applied, preamplifier 48 is rendered active. When a write command is applied, write driver 54 is rendered active. DRAM 1, processor 2, and memory controller 3 are formed on the same chip, and a DRAM input/output buffer is not provided.

Figure 6:
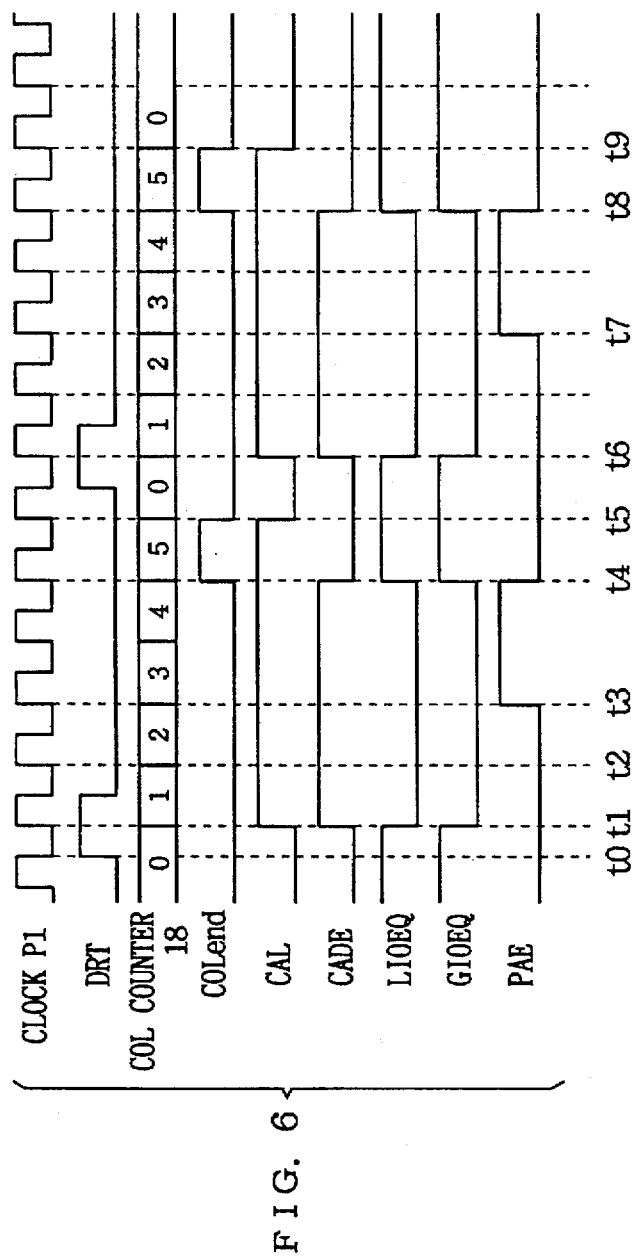
FIG. 6 is a timing chart indicating the generation sequence of a column related control signal of a DRAM control signal generation circuit of FIG. 1.

The generation sequence of an internal operation control signal for the column related circuitry shown in FIG. 5 will be described hereinafter with reference to the timing chart of FIG. 6. FIG. 6 shows an example of the operation when a readout operation designating signal (read command) DRT is applied.

Prior to time t0, the count value of COL counter 18 is 0. Under this state, local IO line equalize designating signal LIOEQ and global IO line equalize designation signal GIOEQ both attain an active state of an H level. Equalize circuits 40 and 42 shown in FIG. 5 are rendered active to precharge and equalize the potentials of local IO lines LIO and ZLIO and global IO lines GIO and ZGIO to respective predetermined potential level.

At time t0, a readout operation designating signal (read command) DRT is applied (rendered active), and the count value of COL counter 18 becomes 1 in synchronization with a rise of clock signal P1 of time t1. In response to COL counter 18 attaining a count value of 1, column address latch designating signal CAL and column address decode enable signal CADE are driven to an H level of an active state. In response, a column address buffer 44 shown in FIG. 5 attains a latching state and provides an internal column address signal. Also, column decoder 46 is activated in response to column address decode enable signal CADE to decode complementary internal column signals generated from the applied internal column address signal to render active column select signal CSL. At time t1, equalize designating signals LIOEQ and GIOEQ are both pulled down to an L level of an inactive state, and equalize circuits 40 and 42 are rendered inactive. Here, block select signal φBA applied to block select gate BSG is rendered active, whereby local IO lines LIO and ZLIO for the selected memory block and global IO lines GIO and ZGIO are connected (signals not shown).

At time t2, the count value of COL counter 18 is incremented to 2 in synchronization with a rise of clock signal P1. An internal column select operation is carried out, whereby memory cell data on the selected column (the potentials of sense nodes of NS and ZNS) is transmitted onto global IO lines GIO and ZGIO via local IO lines LIO and ZLIO.

At time t3, when clock signal P1 rises, the count value of COL counter 18 is incremented to 3, whereby preamplifier enable signal PAE is pulled up to an H level of an active state. In response, preamplifier 48 is rendered active to amplify the memory cell data transmitted onto global IO lines GIO and ZGIO to provide the amplified data to a data bus (DBS). Preamplifier 48 attains a latching state when signal PAE attains an L level.

At time t4, when clock signal P1 rises to an H level, the count value of COL counter 18 is incremented to 5, whereby column operation complete signal COLend is driven to an H level of an active state. In response, an externally provided memory controller detects output of valid data to carry out sampling of data on data bus DBS. At time t4, column address decode enable signal CADE is pulled down to an L level of an inactive state. The column select operation is completed, and the selected column is de-selected. Also, local IO line equalize designation signal LIOEQ and global IO line equalize designating signal GIOEQ are driven to an H level of an active state. In response, local IO lines LIO and ZLIO and global IO lines GIO and ZGIO are both precharged and equalized to respective potential levels.

At time t5, clock signal P1 rises to an H level, and the count value of COL counter 18 is reset to 0. Column operation complete signal COLend indicating that a command can be issued is driven to an L level. Column address latch designating signal CAL is also driven to an L level of an inactive state. Column address buffer 44 attains a through state to be set to a state of incorporating a new column address signal. Preamplifier enable signal PAE is rendered inactive at time t4, and preamplifier 48 attains a latching state. When column operation complete signal COLend is driven to an L level, memory controller 3 determines that a read command can be applied again. Data readout designating signal DRT is rendered active again. At time t6, the count value of COL counter 18 becomes 1. Column address latch designating signal CAL is pulled up to an H level of an active state, and column address buffer 44 attains a latching state. Column address decode enable signal CADE is driven to an H level of an active state, so that column decoder 46 carries out a decoding operation. At time t6, equalize designating signal LIOEQ and GIOEQ both attain an inactive state of an L level, and IO lines LIO, ZLIO, GIO and ZGIO are set to an electrically floating state at respective precharged potentials.

At time t7, the count value of COL counter 18 becomes 3, and preamplifier enable signal PAE is rendered active again. Preamplifier 48 carries out an amplifing operation to transmit readout data onto an internal data bus.

At time t8, the count value of COL counter 18 becomes 5 (in synchronization with a rise of clock signal P1), and the internal column select operation is completed. Column address decode enable signal CADE and preamplifier enable signal PAE are both driven to an L level of an inactive state. Then, local IO line equalize designating signals LIOEQ and GIOEQ are both driven to an H level of an active state.

At time t9, when the count value of COL counter 18 is reset to 0, column address latch designating signal CAL is pulled down to an L level of an inactive state, and column address buffer 40 attains a through state again. During the period from time t8 to time t9, column operation complete signal COLend is pulled up to an H level of an active state again. Memory controller 3 is notified that valid data is output and that a command can be issued.

The data amplified by amplifier 48 is continuously output according to the latching function of that preamplifier. Therefore, memory controller 3 can be notified that the valid data is "ready" by column operation complete signal COLend, so that the valid data is sampled reliably. Column operation complete signal COLend indicates that a read command or a write command can be received at the next cycle to memory controller 3.

In a data write operation mode, an operation similar to that of data readout is carried out according to a write command (data write operation designating signal) DWT. The only difference is that a write driver enable signal WDE is rendered active instead of preamplifier enable signal PAE. A data input/output buffer can further be provided as a data input/output interface.

Figure 7:
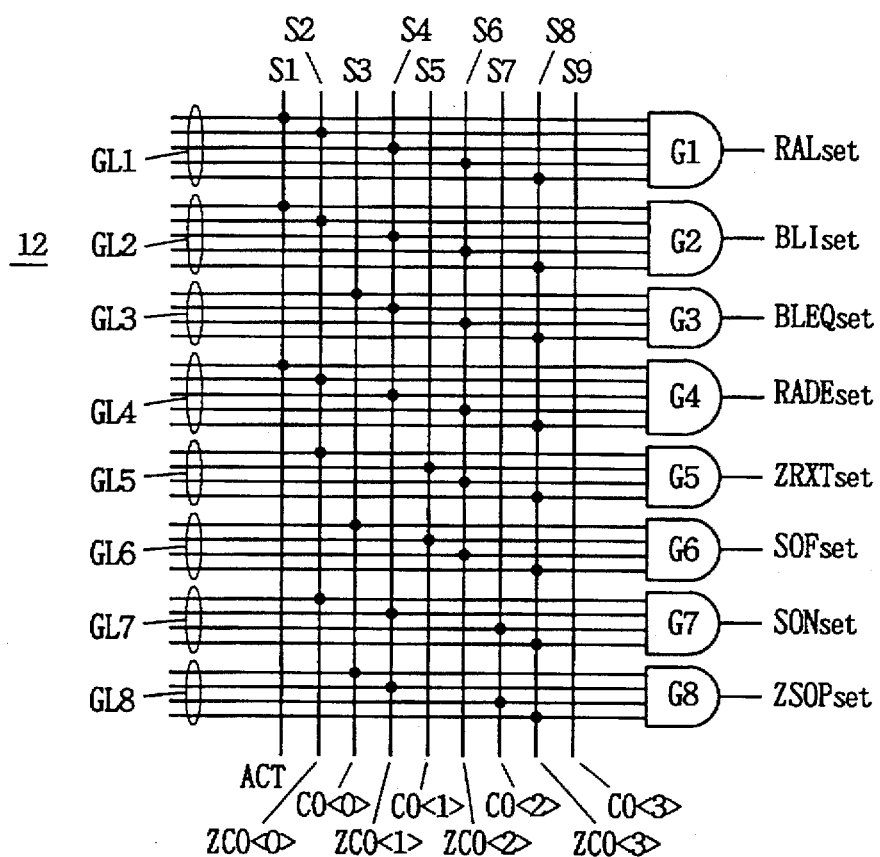
FIG. 7 schematically shows a structure of a decoder array of FIG. 2.

FIG. 7 shows a structure of assert timing decode array 12 of FIG. 2. Negate timing decoder array 16 and assert/negate timing decoder array 20 of FIG. 2 have a similar structure.

Referring to FIG. 7, assert timing decoder array 12 includes signal lines S1–S9 through which active signal ACT and output counts CO <3:0> and ZCO <3:0> from ACT counter 10 are transmitted, gate input signal line group GL1–GL8 disposed in a direction crossing the signal lines S1–S9, and AND gate circuits G1–G8 provided corresponding to gate input line groups GL1–GL8, respectively. Gate input line group GL1 provided corresponding to AND gate G1 is electrically connected to signal lines S1, S2, S4, S6 and S8. Input line group GL2 provided corresponding to AND gate G2 is electrically connected to signal lines S1, S2, S4, S6 and S8. Gate input signal line group GL3 provided corresponding to AND circuit G3 is electrically connected to signal lines S3, S4, S6 and S8. Gate input line group GL4 provided corresponding to AND circuit G4 is electrically connected to signal lines S1, S2, S4, S6 and S8. Gate input line group GL5 provided corresponding to AND circuit G5 is electrically connected to signal lines S1, S5, S6 and S8. Gate input line group GL6 provided corresponding to AND circuit G6 is electrically connected to signal lines S3, S5, S6 and S8. Gate input line group GL7 provided corresponding to AND circuit G7 is electrically connected to signal lines S1, S4, S7 and S8. Gate input line group GL8 provided corresponding to AND circuit G8 is electrically connected to signal lines S3, S4, S7 and S8.

A row address latch designating signal set signal RALset is output from AND circuit G1. A bit line isolation designating signal set signal BLIset is output from AND circuit G2. A bit line equalize designating signal set signal BLEQset is output from AND circuit G3. A row address decode enable signal set signal RADEset is output from AND circuit G4. A word line activation timing designating signal set signal ZRXTset is output from AND circuit G5. A sense amplifier activation signal set signal SOFset is output from AND circuit G6. A sense amplifier activation signal set signal SONset is output from AND circuit G7. A sense amplifier activation signal set signal ZSOPset is output from AND circuit G8. When the set signals provided from AND circuits G1–G8 are driven to H level of an active state, a corresponding designating signal is activated (asserted).

Active signal ACT is applied to AND circuits G1, G2 and G4. Signals RALset, BLIset and RADEset provided from AND circuits G1, G2 and G4 receiving count bits ZCO <0>, ZCO <1>, ZCO <2> and ZCO <3> from ACT counter 10. In response to application of active signal ACT, signals RALset, BLIset and RADEset are immediately rendered active, whereby a latching and decoding operation of a row address signal or isolation of a memory block is carried out. ACT counter 10 is reset to the count value of 0 in a precharge state. Count value ZCO <3:0> all attain a state of 1. The remaining signals are driven to an H level of an active state when the corresponding count bits all attain 1.

In assert timing decoder array 12 shown in FIG. 7, electrical connection are programmed at each crossing of signal lines S1–S9 with gate input signal line groups GL1–GL8. An appropriate establishment of this connection allows an internal operation control signal to be rendered active easily at the required timing. By modifying the electrical connecting position, the activation timing/inactivation timing of these internal operation control signals can readily be adjusted (since the negate timing decoder array also has a similar structure).

Connection between these signal lines S1–S9 and gate input signal line groups GL1–GL8 can be made fixedly by a mask interconnection. Alternatively the connection node may be adapted to be switched according to a control signal. By providing a switching transistor at each respective crossing of signal lines S1–S9 and gate input signal line groups GL1–GL8 and selectively rendering these switching transistors conductive/non-conductive according to a control signal, connection can be changed and a plurality of clock operating frequencies can be accommodated with one chip.

Although the structure of ACT counter 10, PCG counter 14 and COL counter 18 will be described in details afterwards, it is to be noted that these counters are formed of a binary counter that is started in response to application of active signal ACT, precharge signal PCG, read signal DRT and write signal DWT to carry out a counting operation.

Figure 8A:
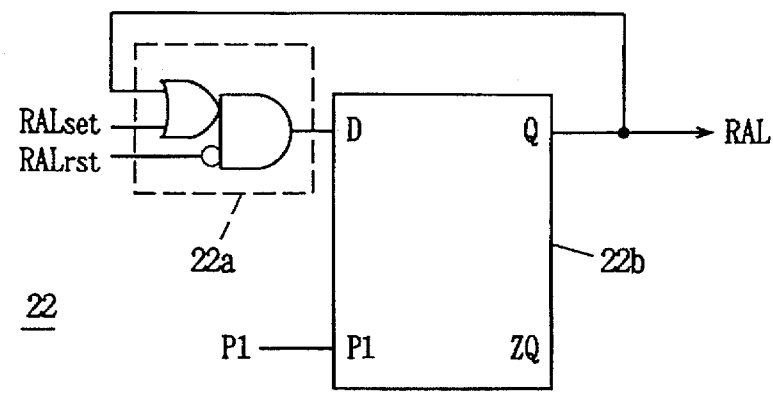
FIG. 8A shows an example of a structure of the DRAM control signal generation circuit of FIG. 2.

FIG. 8A shows a structure of a row address latch designating signal RAL generation unit in DRAM control signal generation circuit 22 shown in FIG. 2. A structure similar to that shown in FIG. 8A is used for each internal operation control signal. Referring to FIG. 8A, a row address latch designating signal generation unit includes an OR/AND composite gate 22a receiving a row address latch designating signal set signal RALset provided from assert timing docoder array 12 shown in FIG. 2, a row address latch reset signal RALrst provided from negate timing decoder array 16 shown in FIG. 2, and a row address latch designating signal RAL, and a D flip-flop 22b for taking in and providing from an output Q an output signal of composite gate 22a in synchronization with a rise of clock signal P1.

Figure 8B:
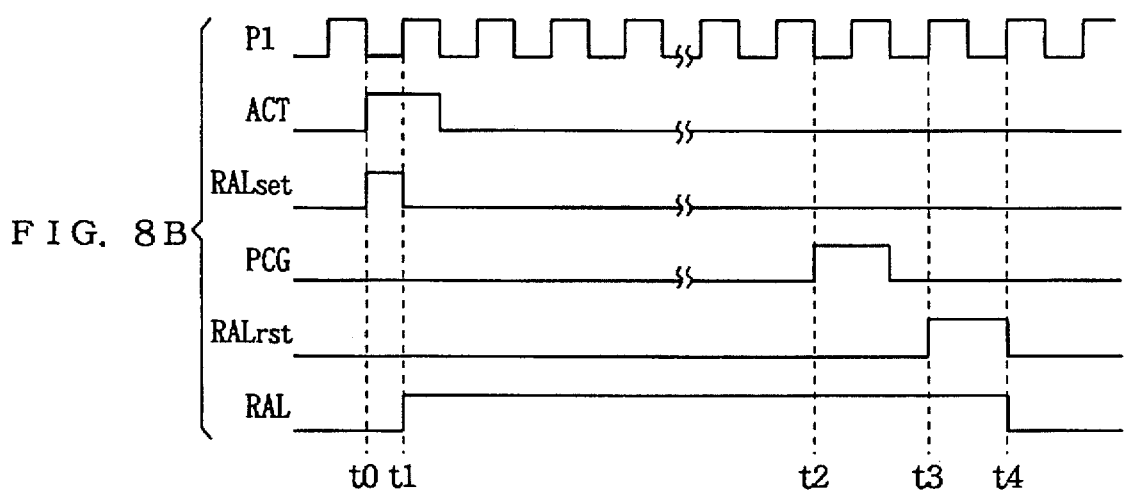
FIG. 8B is a timing chart showing the operation of the circuit shown in FIG. 8A.

Row address latch designating signal RAL is provided from output Q. Composite gate 22a includes an OR gate receiving row address latch designating signal RAL and row address latch designating signal set signal RALset, and a gate circuit receiving an output signal of this OR gate and row address latch designating signal reset signal RALrst. This gate circuit provides a signal of an H level when signal RALrst attains an L level and the output signal from the OR gate attains an H level. The operation of the row address latch designating signal generation unit shown in FIG. 8A will be described hereinafter with reference to the timing chart shown in FIG. 8B.

At time t0, active signal ACT attains an active state of an H level. In response to activation of active signal ACT, signal RALset is rendered active at an H level for half a clock cycle (refer to FIG. 7). In response to signal RASset attaining an H level, the output signal of composite gate 22a is driven to an H level since signal RALrst attains an L level. During this period, clock signal P1 attains an L level, and output signal RAL of D flip-flop 22b maintains an L level.

At time t1 when clock signal P1 rises, D flip-flop 22b fetches and latches the output signal of composite gate 22a. At time t1, signal RALset is pulled down to an L level. However, the output signal of composite gate 22a is still at an H level due to the delay time inherent to composite gate 22a. Therefore, signal RAL from D flip-flop 22b is pulled up to an H level. During the period where signal RAL is at an H level and signal RALrst is at an L level, D flip-flop 22b takes in and latches the signal of an H level received from composite gate 22a in synchronization with clock signal P1. Therefore, signal RAL is rendered active at an H level during this period.

At time t2, precharge signal PCG is rendered active, and PCG counter 14 operates. Reset signal RALset from negate timing decoder array 16 maintains an H level during one clock cycle from time t3 to time t4. During a period when reset signal RALrst is at an H level, the output signal of composite gate 22a is driven to an L level. However, due to the delay time inherent to composite gate 22a, signal RAL from D flip-flop 22b maintains an H level from time t3 to time t4.

At time t4, when clock signal P1 rises to an H level, reset signal RALrst is driven to an L level, whereby the output signal of composite gate 22a makes a transition to an H level. However, the output signal of composite gate 22a is at an L level at the rise of clock signal P1 due to the delay time of composite gate 22a. Therefore, signal RAL output from D flip-flop 22b attains an L level. As a result, the output signal of composite gate 22a is maintained at an L level thereafter.

Thus, the activation/inactivation state of an internal operation control signal according to clock signal P1 can be controlled in response to a set signal and a reset signal from the decoder array.

Figure 9:
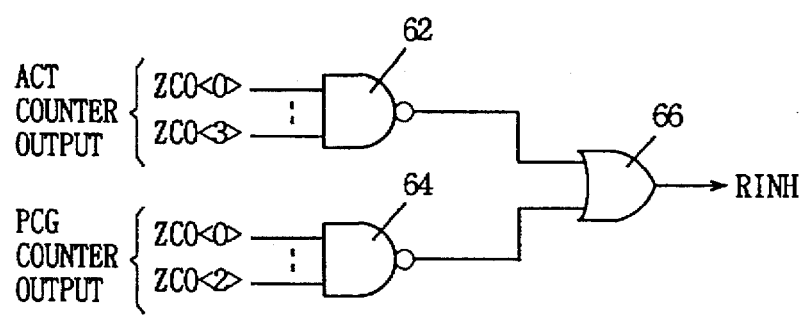
FIG. 9 schematically shows a structure of a row related command inhibit signal generation unit.

FIG. 9 shows an example of a generation unit of a row related command inhibit signal RINH. Referring to FIG. 9, RINH generation unit includes a NAND circuit 62 receiving output bits ZCO <0>–ZCO <3> of ACT counter 10, a NAND circuit 64 receiving output count values ZCO <0>–ZCO <2> of PCG counter 14, and an OR circuit 66 receiving output signals of NAND circuits 62 and 64. NAND circuit 62 provides a signal of an L level when the count value of ACT counter 10 is 0, i.e. when bits ZCO <0>–ZCO <3> all are 1. NAND circuit 64 provides a signal of an L level when the count value of PCG counter 14 is 0, i.e. when bits ZCO <0>–ZCO <2> all are 1.

Therefore, row related command inhibit signal RINH is rendered inactive at an L level only when the counter value of ACT counter 10 is 0 and the count value of PCG counter 14 is 0 to permit input of a row related command. More specifically, NAND circuit 62 determines the inhibit period of a row related command during RAS active period tRAS, and NAND circuit 64 inhibits input of a row related command during RAS precharge time tRP.

In this structure of the RINH generation unit of FIG. 9, NAND circuits 62 and 64 may be included in the decode array, and only OR circuit 66 may be included in DRAM control signal generation circuit 22.

Figure 10:
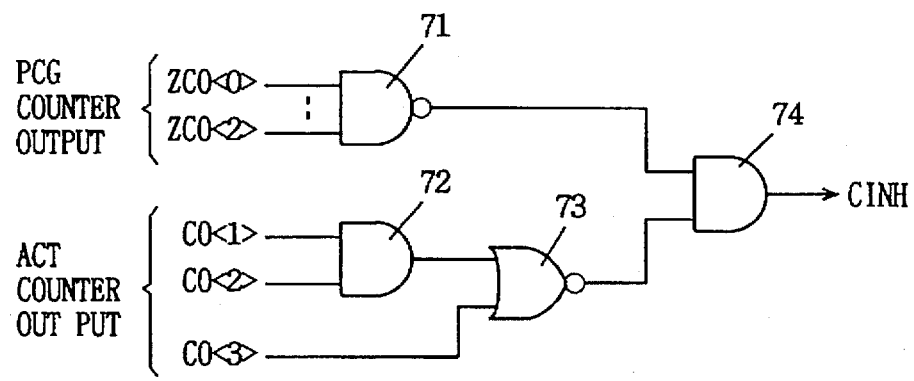
FIG. 10 schematically shows an example of a structure of a column related inhibit signal generation unit.

FIG. 10 shows an example of a column related command inhibit signal CINH generation unit. Referring to FIG. 10, the CINH signal generation unit includes a 3-input NAND circuit 71 receiving output count bits ZCO <0>–ZCO <2> of PCG counter 14, a NAND circuit 72 receiving output count bits CO <1> and CO <2> of ACT counter 10, a 2-input NOR circuit 73 receiving output count bit CO <3> of ACT counter 10 and the output of AND circuit 72, and an AND circuit 74 receiving output signals of NAND circuit 71 and NOR circuit 73. AND circuit 72 and NOR circuit 73 can be formed of a composite gate.

According to the structure shown in FIG. 10, NAND circuit 71 provides a signal of an L level when the count value of PCG counter 14 is 0, i.e. when count bits ZCO <0>–ZCO <2> are all 1. AND circuit 72 provides a signal of an H level when count bits CO <1> and CO <2> of ACT counter 10 are both 1. NOR circuit 73 provides a signal of an L level when the output signal of AND circuit 72 or the count bit CO <3> of ACT counter 10 attains an H level. Therefore, a signal of an L level is provided from NOR circuit 73 when the count value of ACT counter 10 is 6 or more. Therefore, when the count value of PCG counter 14 is 0 or when the count value of ACT counters 10 is 6–11, column related command inhibit signal CINH is driven to an L level of an inactive state.

The above description is provided of a structure wherein ACT counter 10 has its count value reset to 0 when the count value arrives at 11 and PCG counter 14 is reset to 0 at the next cycle when the count value arrives at 5. When a counter of a different structure is employed, the circuit configuration of the portion for generating row related command inhibit signal RINH and column related command inhibit signal CINH differs accordingly.

Column operation complete signal COLend indicates that a column related operation is completed. Signal COLend is to be generated when the count value of COL counter 18 is 5. Preamplifier enable signal PAE is rendered inactive and the internal preamplifier attains a latching state. Valid data is output (at data readout). In a data writing mode, the signal notifies memory controller 3 that the next command can be applied.

[Second Embodiment]

Figure 11:
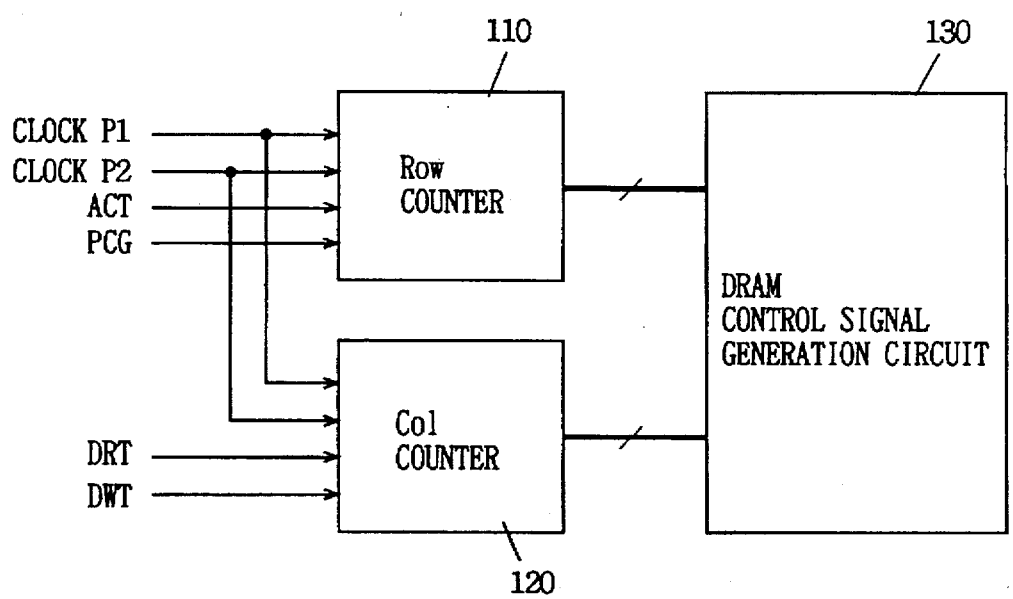
FIG. 11 schematically shows a structure of a control unit of a DRAM according to another embodiment of the present invention.

FIG. 11 is a block diagram schematically showing a structure of a DRAM internal operation control signal generation unit according to a second embodiment of the present invention. Referring to FIG. 11, the internal operation control signal generation unit includes a Row counter 110 having a count operation defined in response to active signal ACT and precharge signal PCG to carry out a count operation according to two phase, non-overlapping clock signals P1 and P2, a Col counter 120 started according to a readout operation designating signal (read command) DRT or a write operation designating signal (write command) DWT for counting the two phase, non-overlapping clock signals P1 and P2, and a DRAM control signal generation circuit 130 for generating an internal operation control signal according to the output count values of Row counter 110 and Col counter 120.

In the structure shown in FIG. 11, the control signal associated with an internal row select operation (control signal associated with array activation/inactivation) is output from Row counter 110 having its count operation adjusted according to active signal ACT and precharge signal PCG. The control signals for column select operation are generated according to the count value of Col counter 120 that is started in response to a signal designating a column select operation (readout operation designating signal (read command) or a write operation designating signal (write command)). DRAM control signal generation circuit 130 decodes these count values to generate an internal operation control signal.

Figure 12:
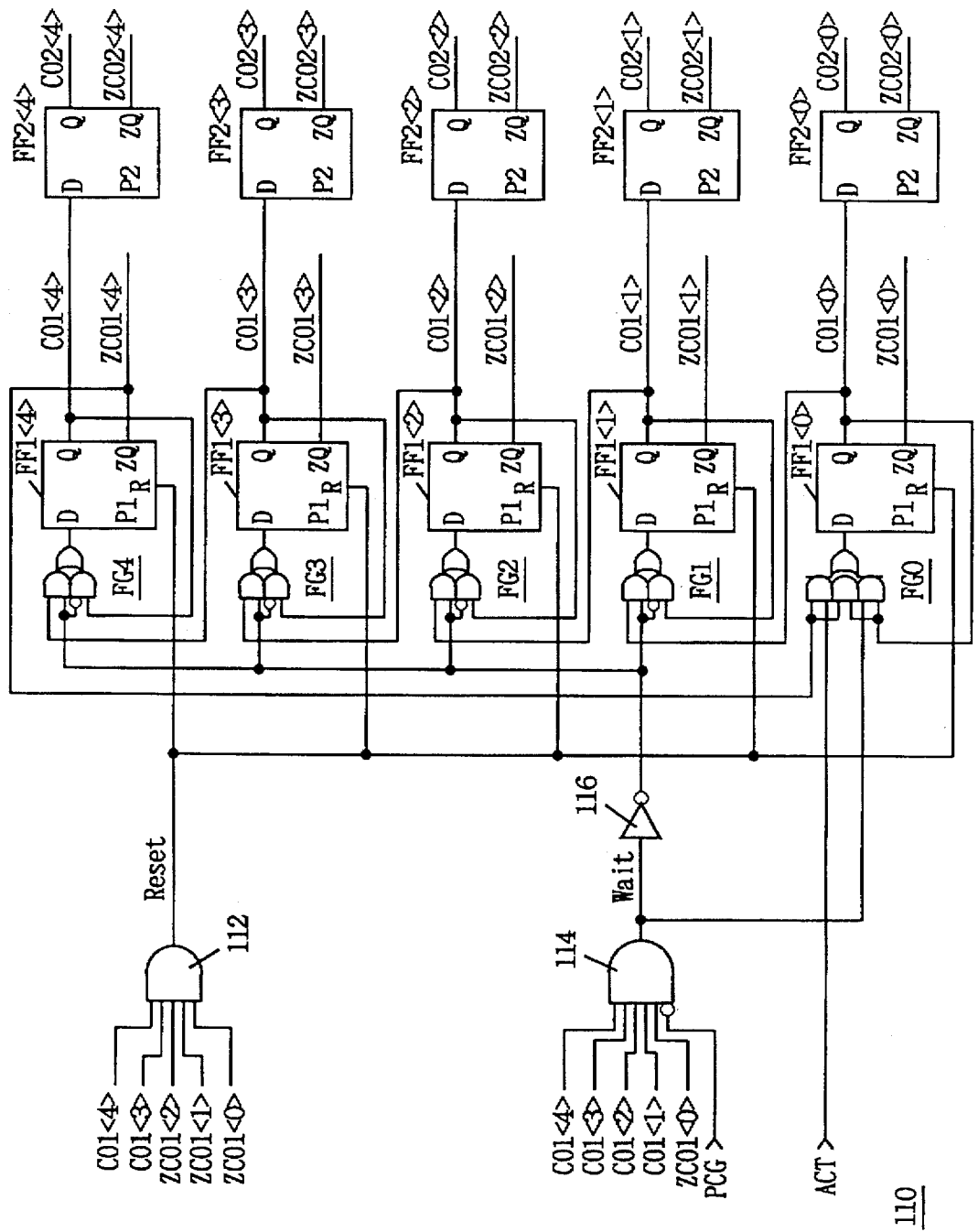
FIG. 12 schematically shows a structure of a Row counter of FIG. 11.

FIG. 12 shows a specific structure of row counter 110 shown in FIG. 11. Referring to FIG. 12, Row counter 110 includes D flip-flops FF1 <0>–FF1 <4> forming a Johnson counter of the first stage, and D flip-flops FF2 <0>–FF2 <4> incorporating output signals CO1 <0>–CO1 <4> of flip-flops FF1 <0>–FF1 <4> in synchronization with clock signal P2 to provide count values CO1 <0>–CO1 <4>. D flip-flops FF1 <0>–FF1 <4> operate in synchronization with clock signal P1. Composite gates FG0–FG4 are provided at respective data inputs Ds of D flip-flops FF1 <0>–FF1 <4>.

Row counter 110 further includes an AND circuit 112 receiving internal count values ZCO1 <0>, ZCO1 <1>, ZCO1 <2>, CO1 <3> and CO1 <4>, a gate circuit 114 receiving internal count bits ZCO1 <0>, CO1 <1>, CO1 <2>, CO1 <3> and CO1 <4> and precharge bit PCG, and an inverter 116 receiving an output signal of gate circuit 114. A reset Reset is output from AND circuit 112 to reset the values of the output count bits CO1 <0>–CO1 <4> of flip-flops FF1 <0>–FF1 <4> to 0.

Composite gate FG0 is equivalent to a structure including an AND gate receiving count bit CO1 <0> and a wait signal Wait from gate circuit 114, an AND gate receiving count bits CO1 <0> and count bits ZCO1 <4>, an AND gate receiving active signal ACT and count ZCO1 <4>, and an OR gate receiving the output signal of these three AND gates. The output signals of the OR gate is applied to data input D of flip-flop FF1 <0>.

Composite gate FG1 is equivalent to a structure including an AND gate having a true input receiving count bit CO1 <1> and a complemental input receiving an output signal of inverter 116, an AND gate receiving count CO1 <1> and the output signal of inverter 116, and an OR gate receiving the output signals of these AND gates. The output signal of this OR gate is applied to data input D of flipflop FF1 <1>.

Composite gate FG2 includes an AND gate having a true input receiving count bit CO1 <2> and a complemental input receiving an output signal of inverter 116, an AND gate receiving count bit CO1 <1> and an output signal of inverter 116, and an OR gate receiving output signals from three AND gates.

Composite gate FG3 is equivalent to a structure including an AND gate having a true input receiving count bit CO1 <3> and a complemental input receiving the output signal of inverter 116, an AND gate receiving count bit CO1 <2> and the output signal of inverter 116, and an OR gate receiving the output signals of these AND gates. The output signal of the OR gate is applied to data input D of D flip-flop FF1 <3>.

Composite gate FG4 is equivalent to a structure including an AND gate having a true input receiving count bit CO1 <4> and a complemental input receiving the output signal of inverter 116, an AND gate receiving count bit CO1 <3> and the output signal of inverter 116, and an OR gate receiving the output signals of these AND gates. The output signal of the OR gate of composite gate FG4 is applied to data input D of D flip-flop FF1 <4>.

AND circuit 112 drives reset signal Reset to an H level when count value CO1 <4:0> of D flip-flops FF1 <4>–FF1 <0> becomes <00011>. Gate circuit 114 drives wait signal Wait to an inactive state of an L level when precharge signal PCG attains an H level. When precharge signal PCG attains an L level and count bit CO1 <4:0> is <11110>, wait signal Wait is rendered active at an H level. In response to the signal Wait attaining an active state of an H level, composite gates FG1–FG4 constantly select count bits CO1 <1>–CO1 <4> that are output from a corresponding D flip-flops to apply the same to data inputs D of the corresponding flip-flop. Therefore, D flip-flops FF1 <1>–FF1 <4> continue to maintain its output count value when wait signal Wait attains an active state of an H level. D flip-flop FF1 <0> selects and provides to data input D its own output count CO1 <0> when wait signal Wait attains H level.

When active signal ACT is applied (rendered active), D flip-flop FF1 <0> drives count value CO1 <0> to 1 (H level) in synchronization with a rise of clock signal P1. In response, a count operation is initiated. A count operation is sequentially carried out until the count value arrives at a predetermined value. When wait signal Wait attain an L level, composite gates FG0–FG4 each select the output count of the D flip-flop of a preceding stage. It is to be noted that flip-flop FF1 <0> of the first stage receives the result of the logical product of count bit CO1 <0> and count ZCO1

<4> its own data input D. In this configuration, D flip-flops FF1 <0>–FF1 <4> form a Johnson counter. Only one bit of output counts CO1 <0>–CO1 <4> of D flip-flops FF1 <0>–FF1 <4> changes its state, and the remaining bits maintain the state of the prior cycle.

D flip-flops FF2 <0>–FF2 <4> of subsequent stages incorporate the output signals of D flip-flops FF1 <0>–FF1 <4> forming a Johnson counter in synchronization with clock signal P2 to provide count values CO2 <0>–CO2 <4>. Therefore, D flip-flops FF2 <0>–FF2 <4> have the function to delay the count value of the Johnson counter for half a clock cycle and to transmit the delayed value. By using the output count values of D flip-flops (Johnson counter) FF1 <0>–FF1 <4> operating in synchronization with clock signal P1 and D flip-flop FF2 <0>–FF2 <4> operating in synchronization with clock signal P2, the activation/inactivation timing of an internal operation control signal can be set in a unit of half a clock cycle. Therefore, the control timing of an internal operation can further be optimized.

Figure 13:
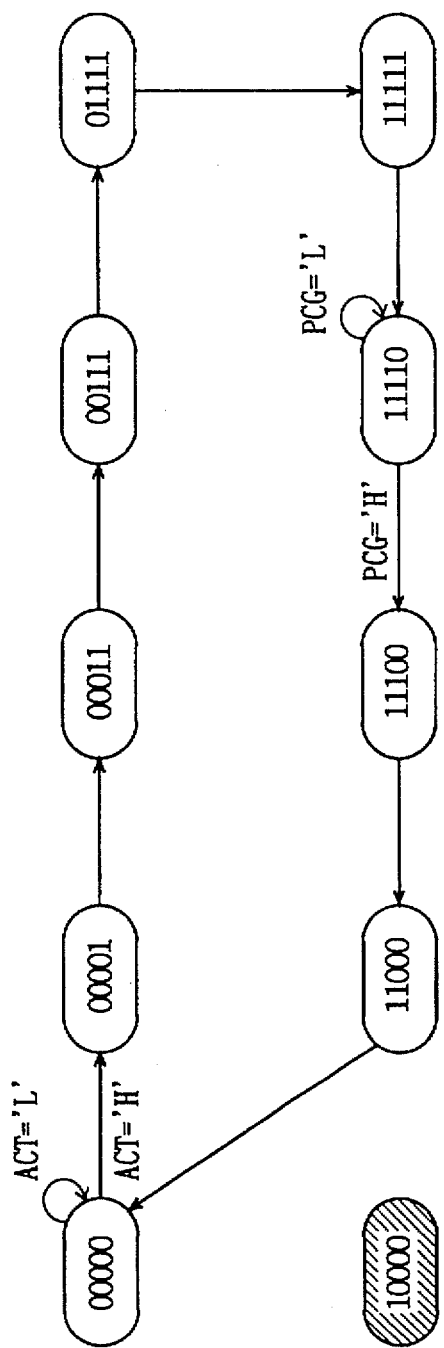
FIG. 13 shows the state transition of the count value of the Row counter of FIG. 12.

FIG. 13 shows the transition of output count values CO1 <0>–CO1 <4> of Johnson counters (D flip-flop) FF1 <0>–FF1 <4> shown in FIG. 12. The transition shown in FIG. 13 occurs according to clock signal P1. The operation of Johnson counter (flip-flops FF1 <0>–FF1 <4>) will be described briefly hereinafter with reference to FIG. 13.

In a reset state, output count FF1 <4:0> of the Johnson counter are all 0. This reset state is maintained during the L level period of active signal ACT. When active signal ACT is pulled up to an H level, the signal applied to data input D of flip-flop FF1 <0> of the first stage attains an H level (composite gate FG0 receives active signal ACT and bit ZCO1 <4>). Therefore, count bit CO1 <0> is modified to 1. Active signal ACT is only applied to composite gate FG0, and the output state of the remaining flip-flops FF1 <1>–FF1 <4> do not change. At the next clock cycle, active signal ACT is restored to an L level. Count bit ZCO1 <4> attains to an H level, and count CO1 <0> also attain to an H level. Output count CO1 <0> of flip-flop FF1 <0> maintains 1 again. Flip-flop FF1 <1> of the next stage selects count bit CO1 <0> and receives the same at data input D via the OR gate since wait signal Wait attains an L level. Therefore, count bit CO1 <1> is modified to 1. This operation is repeated thereafter, whereby count bit CO1 <2>, count bit CO1 <3> and count bit CO1 <4> are sequentially modified to 1. At the next clock cycle, the output signal of composite gate FG0 becomes 0 (since wait signal Wait attains an L level) in response to count bit ZCO1 <4> becoming 0. Therefore, only count bit CO1 <0> is changed to 0.

If precharge signal PCG attains an L level in this state, wait signal Wait from gate circuit 114 is pulled up to an H level, and the output signal of inverter 116 is pulled down to an L level. During the time period in which precharge signal PCG is at an L level, D flip-flops FF1 <0>–FF1 <4> receive their own output count values CO1 <0>–CO1 <4> at the corresponding data inputs D via corresponding composite gates FG0–FG4. Therefore, each count bit CO1 <0>–CO1 <4> does not change.

When precharge signal PCG attains to an H level to designate a precharge operation, wait signal Wait is pulled down to an L level. The count wait operation state is canceled. Under this state, the Johnson counter resumes a count operation, whereby the count values of the flip-flops of preceding stages (lower bit sides) are sequentially transmitted. When the values of count bits CO1 <2>, CO1 <1> and CO1 <0> become 0, reset signal Reset from AND circuit 112 is rendered active. All count bits CO1 <0>–CO1 <4> are reset to 0, and the Johnson counter is restored to an initial state.

As described above, the count value of the Johnson counter in a count operation is altered one bit at a time. By employing an AND gate or an OR gate in generating an internal operation control signal according to the count value of the Johnson counter, the hazard occurring when both inputs are altered simultaneously (the state of an erroneous output signal due to an unstable input signal) is suppressed since the logic of one input does not change. Therefore, an internal operation control signal can be generated stably. In a reset state, the plurality of D flip-flops (flip-flop FF1 <3> and FF1 <4> in the embodiment shown in FIG. 12) are reset simultaneously. However, by generating an internal operation control signal employing an AND circuit or an OR circuit, the logic of not only the output count bits of the plurality of flip-flops reset at the same time but also other count bits can be taken, and a hazard-free internal operation control signal can be output.

Figure 14:
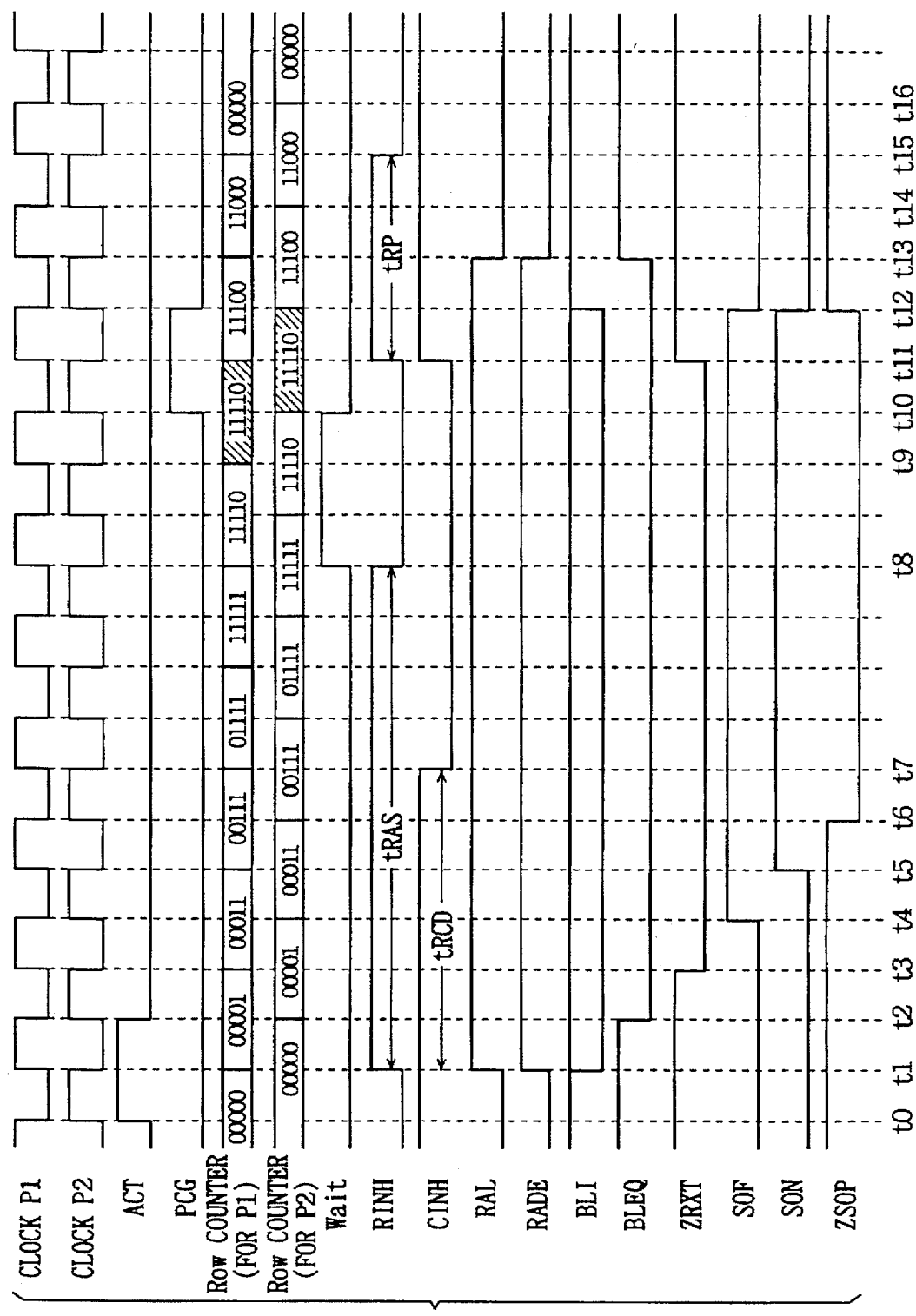
FIG. 14 is a timing chart indicating the generation sequence of a row related control signal of the DRAM control signal generation circuit of FIG. 11.

FIG. 14 is a timing chart showing the generation sequence of a row related internal control signal. In FIG. 14, the Row counter for P1 corresponds to D flip-flops FF1 <4>–FF1 <0> shown in FIG. 12, and Row counter for P2 corresponds to D flip-flop FF2 <4>–FF2 <0> shown in FIG. 12.

Prior to time t0, DRAM 1 is in a precharge state. Control signals RIHN, RAL, RADE, SOF and SON are at an L level, and control signals CINH, BLI, BLEQ and ZSOP are at an H level. In such a state, each column in a memory block is connected to a corresponding sense amplifier group in the DRAM array to be precharged to an intermediate potential. Input of a row related command and a column related command is permitted.

The count values of P1-Row counter and P2-Row counter are both set to 0.

Following the application of active signal ACT at time t0, control signals RINH, RAL and RADE are rendered active at an H level in synchronization with a rise of clock signal P1 at time t1 (or in synchronization with a fall of clock signal P2). As a result, subsequent input of a row related command is inhibited. Also, an externally applied address signal is latched and then decoded. Control signal BLI is driven to an H or L level. The selected memory block are kept to be connected to the sense amplifier group, whereas the non-selected memory block forming a pair with the selected memory block is isolated from the corresponding sense amplifier group. The non-selected memory block pair is connected to a corresponding sense amplifier group.

At time t2, the count value of the P2-Row counter is incremented by one in synchronization with a rise of clock signal P2. In response, control signal BLEQ is rendered inactive at an L level. As a result, the precharge operation of a bit line (selected memory block) in the DRAM array is inhibited.

At time t3, the count value of the P1-Row counter is changed by 1 bit. In response, word line timing defining signal ZRXT is rendered active at an L level. An active word line drive signal is transmitted onto a selected word line.

At time t4, the count value of the P2-Row counter is changed by 1 bit (in synchronization with a rise of clock signal P2). Sense amplifier activation signal SOF is rendered active at an H level, whereby the sense amplifier initiates a slow sensing operation.

At time t5, the count value of the P1-Row counter is changed by 1 bit in synchronization with a rise of clock signal P1. In response, sense amplifier activation signal SON is pulled up to an H level of an active state, whereby the sense amplifier group effects a sensing operation at high speed.

At time t6, when clock signal P2 rises to an H level, the count value of the P2-Row counter is changed by 1 bit. Sense amplifier activation signal ZSOP is rendered active of an L level. The potential of the bit line is pulled up in DRAM 1.

At time t7, the count value of the P1-Row counter is changed by 1 bit in synchronization with a rise of clock signal P1. In response, column related command inhibit signal CINH is rendered inactive at an L level to permit input of a column related command. Subsequently, a control signal (command) for selecting a column that will be described afterward is applied to effect a column select operation.

At time t8 when clock signal P1 rises to an H level, the count value of the P1-Row counter is altered. In response, wait signal Wait is rendered active at an H level, and row related command inhibit signal RINH is pulled down to an L level. The P1-Row counter and P2-Row counter maintain their count values during the period where precharge signal PCG is not applied until time t10.

Therefore, the count value of the P1-Row counter does not change even when the clock signal P1 rises to an H level at time t9.

At time t10 when precharge signal PCG is pulled up to an H level, wait signal Wait is rendered inactive at an L level. At time t11, the count value of the P1-Row counter is reset to 0 in synchronization with a rise of clock signal P1. Row related command inhibit signal RINH is rendered active again at an H level. At this time t11, word line drive timing defining signal ZRXT is rendered inactive at an H level. The selected word line is driven to a de-selected state. Also, column related command inhibit signal CINH attains an active state again at an H level to inhibit input of a column related command (control signal).

At time t12 when clock signal P2 is pulled up to an H level, the count value of the P2-Row counter is reset to 0 (decimal). In response, bit line isolation designating signal BLI is restored to an H level. All the memory blocks are connected to the sense amplifier groups. Also, sense amplifier activation signals SOF, SON, and ZSOP are rendered inactive.

At time t13 when clock signal P1 rises to an H level, the count value of the P1-Row counter is altered, and control signals RAL and RADE are rendered inactive. Also, bit line equalize designating signal BLEQ attains an H level. As a result, the bit line is precharged/equalized in the DRAM memory array. Input of a new address signal is permitted, and the decode operation of the row decoder is inhibited.

At time t14 when clock signal P2 rises, the count value of the P2-Row counter is altered. At time t15, a reset signal is output in synchronization with a rise of clock signal P1. The count value of the P1-Row counter is reset to 0 (decimal). At time t16, the count value of the P2-Row counter is also reset to 0 (decimal).

The period from time t1 to time t8 is the RAS active period tRAS. The period from time t1 to t7 is the RAS-CAS delay time tRCD. The period from time t11 to time t15 is the RAS precharge period tRP.

As shown in FIG. 14, the activation/deactivation timing of each control signal can be adjusted in half a clock cycle precision by using two phase, non-overlapping clock signals P1 and P2. The internal operation timing can be optimized to allow high speed operation.

Figure 15:
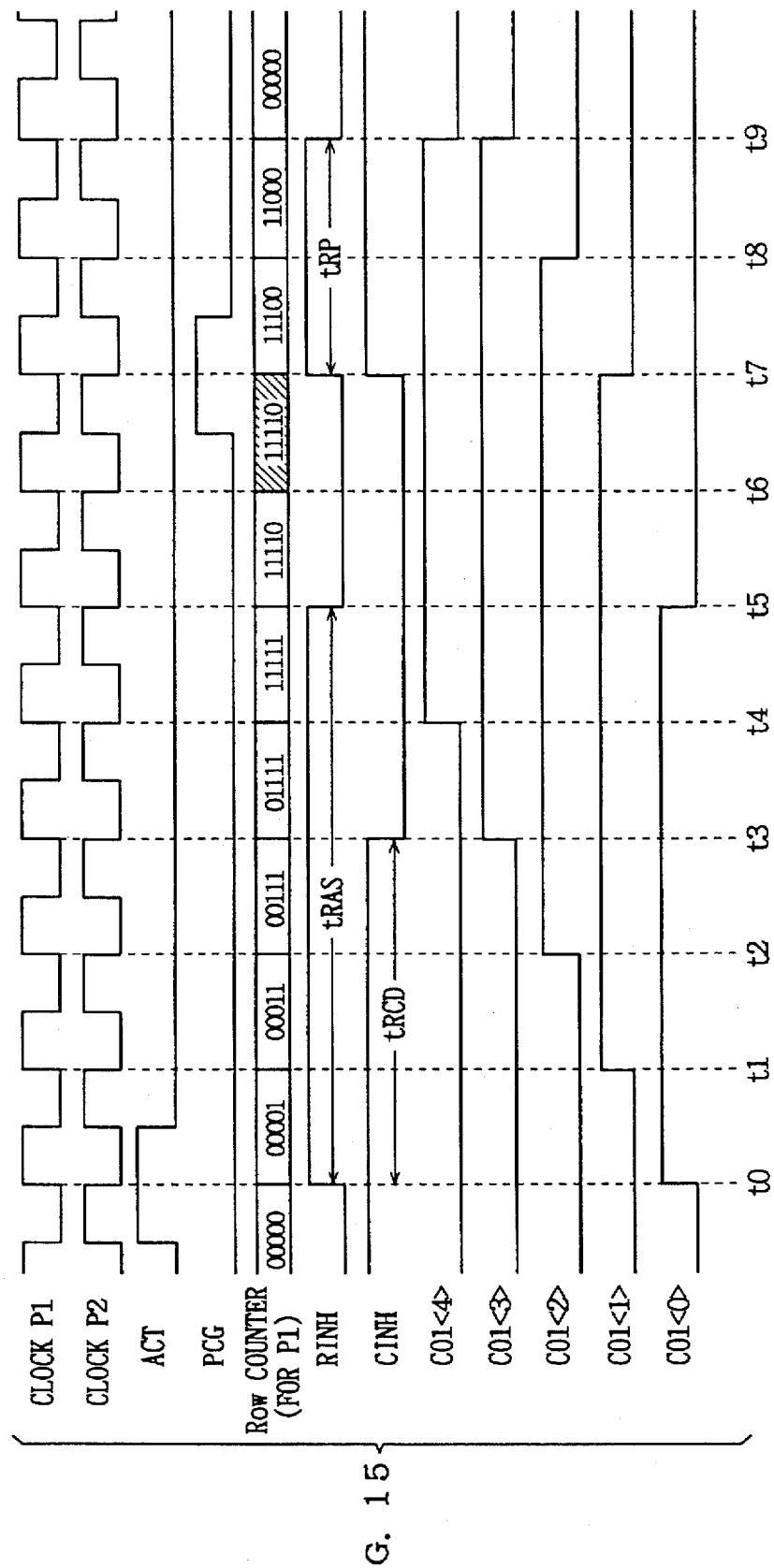
FIG. 15 is a timing chart showing the correspondence between the count bit of the Row counter cell and the row and column related command inhibit signals, for forming a control logic circuit to generate an internal operation control signal.

FIG. 15 is a timing chart showing the transition of output count bits CO1 <4>–CO1 <0> of D flip-flops FF1 <4>–FF1 <0> when active signal ACT and precharge signal PCG are applied. As shown in FIG. 15, count bits CO1 <0>–CO1 <4> are sequentially pulled up to an H level in synchronization with respective rises of clock signal P1 of time t0 to time t4.

At time t5, count bit CO1 <0> is driven to 0 in synchronization with a rise of clock signal P1. Application of precharge signal PCG causes count bit CO1 <1> to be altered to 0 at time t7. At time t8, count bit CO1 <2> is altered to 0 in synchronization with a rise of clock signal P1. At time t9, the reset signal is activated. Count bits CO1 <3> and CO1 <4> are both reset to 0.

A logic gate for generating row related command inhibit signal RINH and column related command inhibit signal CINH can be formed in accordance with the states of count bits CO1 <4>–CO1 <0>. More specifically, row related command inhibit signal RINH attains an H level between times t0–t5 and between times t7–t9. Column related command inhibit signal CINH attains an L level between times t3–t7.

Figure 16:
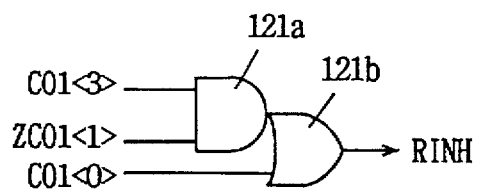
FIG. 16 shows an example of a structure of a row related command inhibit signal generation unit.

FIG. 16 shows a structure of the portion for generating row related command inhibit signal RINH. Referring to FIG. 16, a row related command inhibit signal generation unit includes an AND gate 121a for receiving output count bits CO1 <3> and ZCO1 <1> of D flip-flops FF1 <3> and FF1 <1>, and a 2-input OR gate 121b receiving an output signal of AND gate 121a and count bit CO1 <0>. AND gate 121a and OR gate 121b are formed as a composite gate. AND gate 121a renders row related command inhibit signal RINH active at an H level during RAS precharge time tRP. OR gate 121b renders row related command inhibit signal RINH active at an H level during RAS active period tRAS. In FIG. 16, count bit CO1 <4> may be used instead of count bit CO1 <3>.

Figure 17:
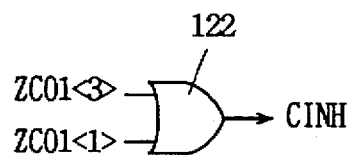
FIG. 17 shows an example of a structure of a column related command inhibit signal generation unit.

FIG. 17 shows a structure of a column related command inhibit signal CINH generation unit. Referring to FIG. 17, a column related command inhibit signal generation unit is formed of a 2-input OR gate 122 receiving count bits ZCO1 <3> and ZCO1 <1>. As shown in FIG. 15, column related command inhibit signal CINH attains an L level during a period of times t3–t7. In this period, count bits ZCO1 <1> and ZCO1 <3> are both 0. More specifically, count bits CO1 <1> and CO1 <3> both attain an H level (1). By ORing count bit ZCO1 <1> and ZCO1 <3>, column related command inhibit signal CINH attains an L level during a period of times t3–t7 shown in FIG. 15.

Figure 18:
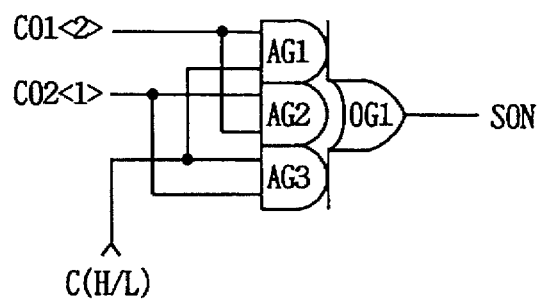
FIG. 18 shows an example of a structure of a logic circuit for generating an internal operation control signal.

FIG. 18 shows a structure of the portion for generating sense amplifier activation signal SON. Referring to FIG. 18, a sense amplifier activation signal generation unit includes an AND gate AG1 receiving a mode designating signal C(H/L) and count bit CO1 <2>, an AND gate AG2 receiving count bits CO1 <2> and CO2 <1>, an AND gate AG3 for receiving a mode designating signal C(H/L) and count bit CO1 <1>, and an OR gate OG1 receiving outputs of AND gates AG1–AG3. Gates AG1–AG3 and OG1 are formed as a composite gate. Sense amplifier activation signal SON is provided from OR gate OG1.

Mode designating signal C(H/L) is set to an H or L level. When mode designating signal C(H/L) is set to an H level, the sense amplifier activation signal generation unit acts as a logic gate for ORing count bits CO1 <2> and CO1 <1>. When mode designating signal C(H/L) is set to an L level, the sense amplifier activation signal generation unit acts as a logic gate for ANDing count bits CO1 <2> and CO2 <1>. By specifying the logic level of mode designating signal C(H/L), the activation timing of sense amplifier activation signal SON can be adjusted. By taking advantage of count bits that make transition according to clock signals P1 and P2 such as count bits CO1 <2> and CO2 <1>, the activation timing of sense amplifier activation signal SON can be adjusted by half a clock cycle of clock signals P1 and P2. Mode designating signal C(H/L) can be set fixedly by a bonding wire or mask interconnection during the manufacturing process, or can be set by a software as will be described in detail afterwards (logic level of mode designating signal C(H/L) is set by a mode specify bit stored in a register). By employing a composite gate as shown in FIG. 18, the active/inactive timing of internal operation control signal can be set corresponding to the operating frequency of clock signals P1 and P2. A plurality of types of DRAMs that can operate most efficiently in a plurality of operating cycles can be realized with one chip.

FIG. 19A shows a specific structure of the Col counter shown in FIG. 11. Referring to FIG. 19A, Col counter 120 includes D flip-flops CFF1 <1> and CFF1 <0> carrying out a count operation in synchronization with clock signal P1, D flip-flops CFF2 <1> and CFF2 <0> for incorporating, latching, and outputting count bits CO1 <1> and CO1 <0> output from D flip-flops CFF1 <1> and CFF1 <0> in synchronization with clock signal P2, an OR circuit 125 for receiving readout operation designating signal (read command) DRT and write operation designating signal (write command) DWT, and an AND circuit 127 for receiving output counter bits CO1 <1> and CO1 <0> of D flip-flops CFF1 <1> and CFF1 <0>.

D flip-flop CFF1 <0> includes a reset input R for receiving reset signal Reset from AND circuit 127, a data input D receiving an output signal of composite gate FGC, and outputs Q and ZQ for providing count bits CO1 <0> and ZCO1 <0>. D flip-flop CFF1 <1> includes a reset input R for receiving reset signal Reset from AND circuit 127, a data input D for receiving count bit CO1 <0>, and outputs Q and ZQ for providing count bits CO1 <1> and ZCO1 <1>. Composite gate FGC is equivalent to a structure including an OR circuit receiving count bit CO1 <0> and the output signal of OR circuit 125, and an AND gate for receiving the output signal of this OR gate and count bit ZCO1 <1>.

Col counter 120 further includes a D flip-flop FF1R for taking in data readout designating signal DRT in synchronization with clock signal P1, a D flip-flop FF1W for taking in data write designating signal DWT in synchronization with clock signal P1, and D flip-flops FF2R and FF2W for taking in, latching, and providing output signals O1R and O1W of D flip-flops FF1R and FF1W, respectively. Flip-flops FF1R, FF2R, FF1W and FF2W indicate whether the column select operation is carried out for reading out data or for writing data. More specifically, when readout operation designating signal DRT is applied, preamplifier enable signal PAE is rendered active. When data write designating signal DWT is applied, write driver enable signal WDE is rendered active.

FIG. 19B shows the state transition of the output count of the COL counter shown in FIG. 19A. The operation will be briefly described hereinafter.

When readout operation designating signal DRT or write operation designating signal DWT is applied, the output signal of composite gate FGC attains an H level. Count bit CO1 <0> output from D flip-flop CFF1 <0> is pulled up to an H level (1) in synchronization with a rise of a clock signal P1. In D flip-flop CFF1 <1>, count bit CO1 <0> attains an L level at the rise of clock signal P1. Output count bit CO1 <1> makes no transition and maintains the state of 0. Here, in a reset state, count bits CO1 <1> and CO1 <0> are both held at the state of 0.

Then, at the application of clock signal P1, count bit CO1 <1> of D flip-flop CFF1 <1> is altered to 1. At the next clock cycle, output signal Reset of AND circuit 127 attains an H level. D flip-flop CFF1 <1> and CFF 1 <0> are reset. Count bits CO1 <1> and CO1 <0> are reset to 0.

When readout operation designating signal DRT is applied, D flip-flop FF1R provides output O1R of an H level. When data write designating signal DWT is applied, D flip-flop FF1W provides output O1W of an H level.

Figure 19:
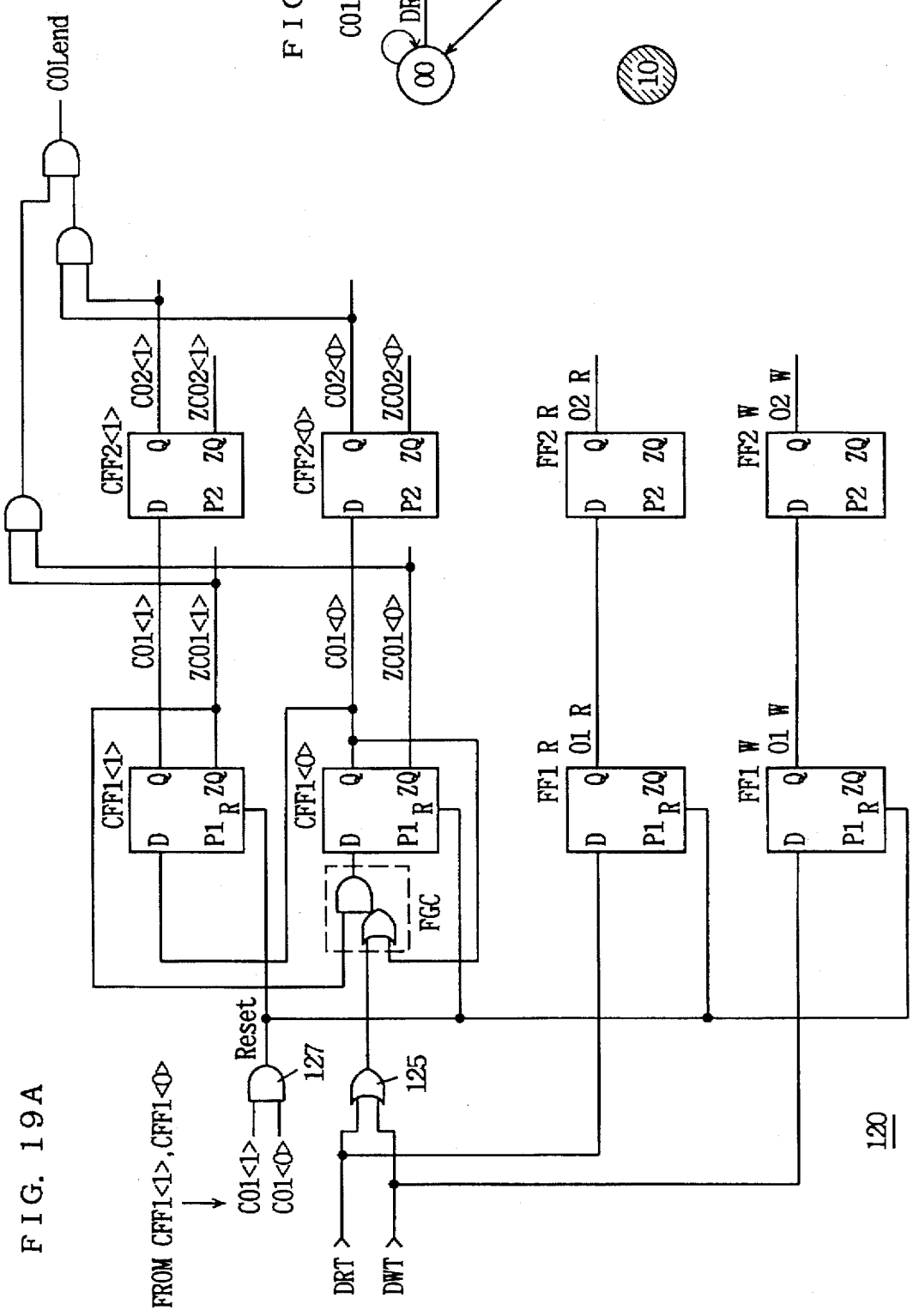
FIGS. 19A and 19B show a structure and state transition sequence, respectively, of a Col counter shown in FIG. 11.

According to the structure of FIG. 19, a plurality of flip-flops are reset at the same time into a reset state. However, by providing a structure in which an internal operation control signal is generated using an AND circuit or an OR circuit receiving a count bit that is altered in a direction opposite to that of these count bits, the hazard at the time of reset can be prevented to generate an internal operation control signal properly even when a plurality of flip-flops are reset at the same time. D flip-flops CFF2 <1>, CFF2 <2>, FF2R, and FF2W each latch and provide the output of a corresponding D flip-flop according to clock signal P2. Similarly to the Row counter, counting is effected delayed by half a cycle.

When count bits CO1 <1> and CO1 <0> both become 1 in the structure of FIG. 19A, reset signal Reset is rendered active at an H level. Flip-flops CFF1 <1> and CFF1 <0> are shown being reset. In this case, count bit 11 must be held for one clock cycle. This reset is effected at the next clock cycle. Such a structure can be easily implemented by simply providing a D flip-flop operating in synchronization with clock signal P1 at the output portion of AND circuit 127. D flip-flop CCF1 <1> and CFF1 <0> may be implemented such that reset is effected at the rise of clock signal P1. The same applies for the structure of the Row counter. Alternatively, a structure can be implemented in which all the flip-flops are reset when reset signal Reset is pulled down to an L level from an H level instead of the structure where the above-described D flip-flops are provided.

Figure 20:
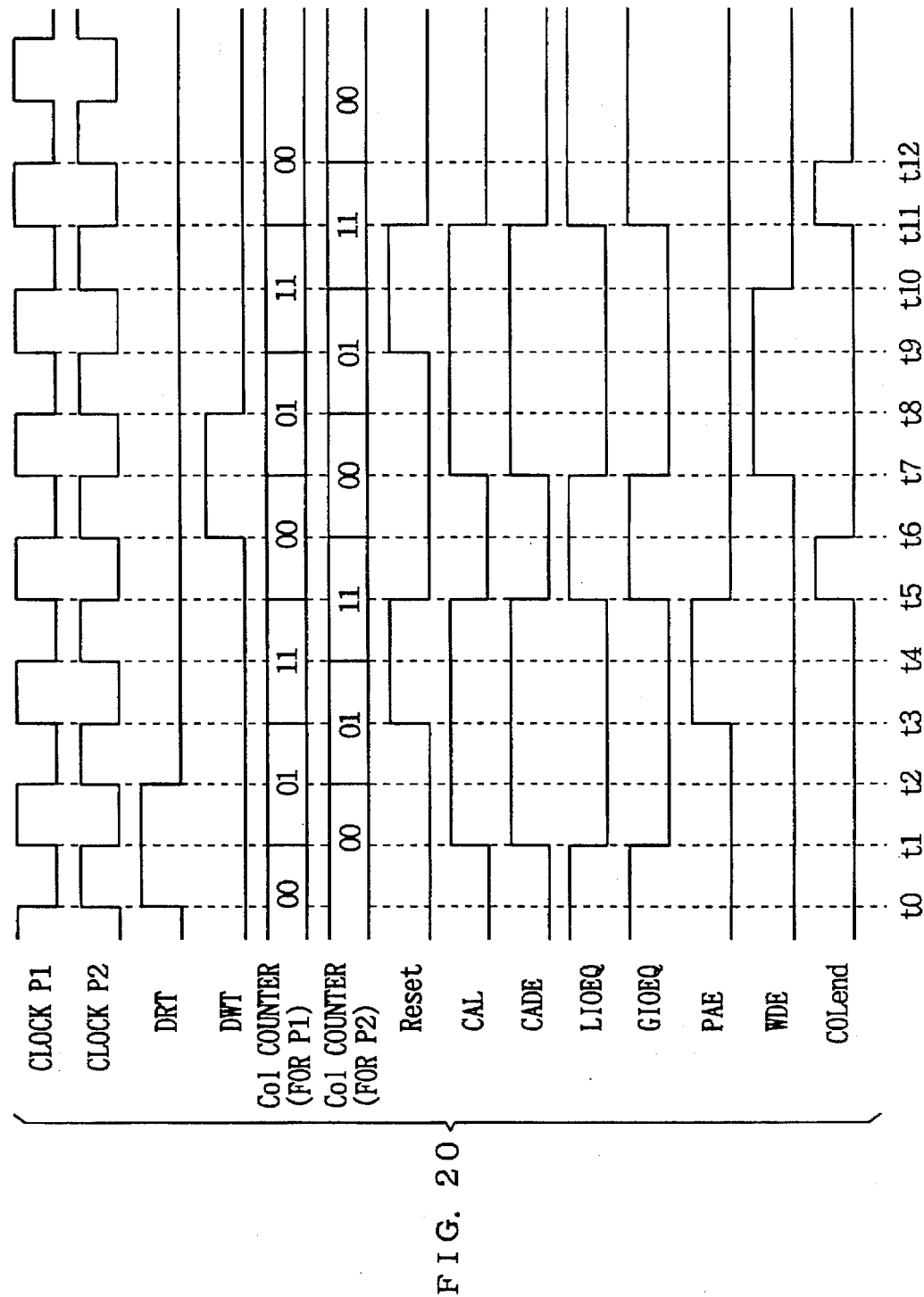
FIG. 20 is a timing chart indicating the generation sequence of a count value of the Col counter shown in FIGS. 11 and 19 and a column related control signal generated from the DRAM control signal generation circuit.

FIG. 20 is a timing chart showing the generation sequence of an internal operation control signal associated with a column selection of DRAM control signal generation circuit 130 shown in FIG. 11. The operation sequence of a column selection related internal operation control signal (data write/read) will be described hereunder with reference to FIGS. 19 and 20.

At time t0, data readout designating signal DRT is applied. At time t1, the count value of clock P1-Col counter is altered to 01 in synchronization with a rise of clock signal P1. Here, the clock P1-Col counter corresponds to D flip-flops CFF1 <1> and CFF1 <0> shown in FIG. 19. The clock P2-Col counter corresponds to D flip-flops CFF2 <1> and CFF2 <0> shown in FIG. 19. In synchronization with the change in the count value of the P1-Col counter at time t1, column address latch designating signal CAL and column address decoding enable signal CADE are rendered active at an H level. Global IO lines equalize designating signal GIOEQ and local IO line equalize designating signal LIOEQ are rendered inactive at an L level. At time t2, the count value of P2-Col counter is altered in synchronization with a rise of clock signal P2.

At time t3, the count value of the P1-Col counter is altered to 11 in synchronization with a rise of clock signal P1. Reset signal Reset is driven to an H level. Since the flip-flop is reset in synchronization with a fall of reset signal Reset or a rise of clock signal P1, each count bit is not yet reset. In synchronization with a rise of clock signal P1 at time t3, preamplifier enable signal PAE is rendered active. The preamplifier effects an amplifying operation to transmit the amplified data onto the data bus.

At time t4, the count value of the P2-Col counter is altered to 11 in synchronization with a rise of clock signal P2.

At time t5 when clock signal P1 is driven to an H level, reset signal Reset is pulled down to an L level. The P1-Col counter is reset, and the count value is altered to 00. At time t5, each of control signals CAL, CADE and PE are rendered inactive at an L level, and equalize designating signals LIOEQ and GIOEQ are both driven to an H level. Thus, the column select operation is completed. When preamplifier enable signal PAE is driven to an L level, the preamplifier attains a latching state to maintain the state of latching the previously read out data. In response to completion of a column selection operation at time t5, column related operation complete designating signal COLend is pulled up to an H level to permit issue of the next command for memory controller 3. Column related operation complete signal COLend can be used as a signal indicating that valid data is output onto the data bus.

At time t6, clock signal P2 rises to an H level, and column operation complete signal COLend is rendered inactive at an L level. Write operation designating signal DWT is applied at this time t6.

At time t7, control signals CAL and CADE are pulled up to an H level, and equalize designating signals LIOEQ and GIOEQ are pulled down to an L level in response to write operation designating signal DWT. Write driver enable signal WDE is pulled down to an H level at time t7 during this data writing.

At time t8, the count value of the P2-Col counter is altered from the reset value in synchronization with a rise of clock signal P2.

At time t9, reset signal Reset attains an H level in synchronization with a rise of clock signal P1.

At time t10, clock signal P2 rises to an H level, and write driver enable signal WDE is rendered inactive at an L level. Write data is already transmitted to the sense node of the sense amplifier via the global IO line and local IO line.

At time t11, clock signal P1 rises to an H level, and reset signal Reset is pulled down to an H level. The count value of the P1-Col counter is reset to 00. Each of control signals CAL and CADE is pulled down to an L level, and equalize designating signals LIEQ and GIEQ are pulled up to an H level. Therefore, precharging of the column select unit is effected. At time t11, column related operation complete signal COLend is driven to an H level to indicate the end of a write operation and to permit input of a next command. At time t12, the count value of the P2-Col counter is reset to 00 in synchronization with a rise of clock signal P2.

In the signal waveform diagram of FIG. 20, each signal makes a transition in synchronization with a rise of clock signal P1. However, the active/inactivation period of each control signal can be adjusted in half a clock cycle precision by employing a structure as shown in FIG. 18.

By using a Johnson counter as a counter for counting a clock signal as described above, a single count bit is altered in each clock cycle. Generation of an internal operation control signal in response to receipt of the output bits of the counter by a logic gate allows proper outputting of an internal operation control signal without hazard. By using two-phase, non-overlapping clock signals as clock signals, the active/inactive timing of the internal operation control signal can be adjusted in half a clock cycle precision. Therefore, each internal operation control signal can be rendered active/inactive at an optimum timing to realize high speed access.

By providing a structure in which logic for generating an internal operation control signal is selectively switched by a control signal through a composite gate, the active/inactive timing of an internal operation control signal can be adjusted to accommodate a plurality of operating frequencies.

[Other Structures of Generation Unit of Internal Operation Control Signal]

Figure 21A:
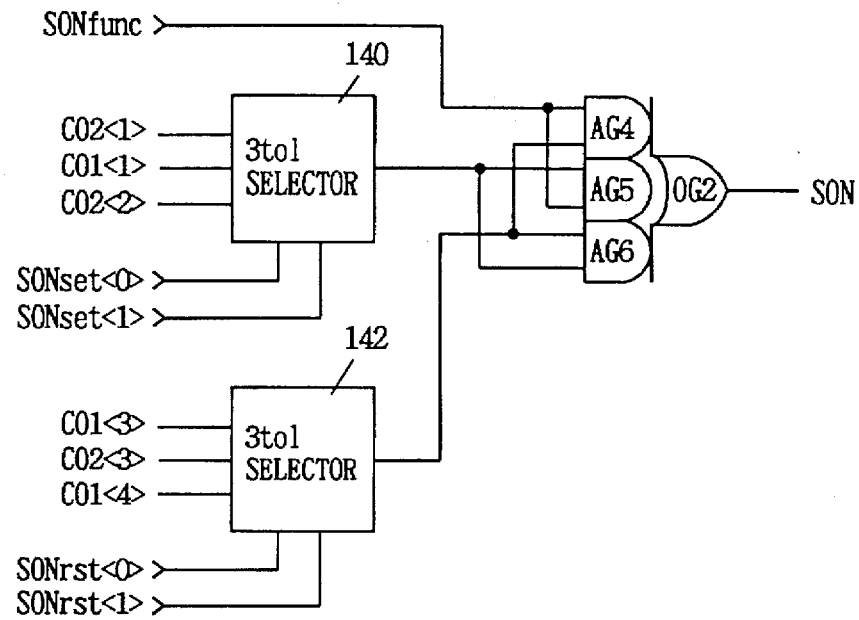
FIGS. 21A and 21B show modification of a logic circuit for generating a control signal included in the DRAM control signal generation circuit.
Figure 21B:
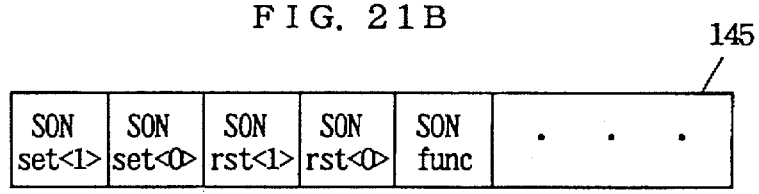

FIGS. 21A and 21B show other structures of a DRAM control signal generation circuit. FIG. 21A shows the portion of generating sense amplifier activation signal SON.

Referring to FIG. 21A, a sense amplifier activation signal generation unit includes a 3 to 1 selector 140 for selecting one of the count bits CO2 <1>, CO1 <1> and CO2 <2> of the Row counter according to select signals SONset <0> and SONset <1>, a 3 to 1 selector 14 for selecting one of count bits CO1 <3>, CO2 <3> and CO1 <4> according to select signals SONrst <0> and SONrst <1>, an AND gate AG4 receiving a function control signal SONfunc and an output signal of selector 142, an AND gate AG5 receiving control signal SONfunc and an output signal of selector 140, an AND gate AG6 receiving output signals of selectors 140 and 142, and an OR gate OG2 receiving output signals of AND gate AG4–AG6. Gates AG4–AG6 and OG2 are formed of a composite gate.

By setting function control signal SONfunc to an H level or an L level, the logic operation performed by the sense amplifier activation signal generation unit is determined to be an AND or OR operation. This is equivalent to the structure for control signal C(H/L) in FIG. 18. By adjusting the active/inactive period of the sense amplifier with the use of selectors 140 and 142, the active/inactive period of the sense amplifier can be adjusted correspondingly to an operating frequency. Thus, a DRAM that operates at the optimum operation timing can be realized.

In order to specify the selection path of selectors 140 and 142, control signal SONset <0>, SONset <1>, SONrst <0> and SONrst <1> applied to selectors 140 and 142 are stored in a register 145 as shown in FIG. 21B. The storage of data in register 145 is carried out under the control of a memory controller or a processor by means of a software. By storing a signal (bit) for controlling the active/inactive timing of an internal operation control signal in register 145, the internal operation active/inactive timing can be adjusted in compliance with an operating frequency by a software.

Figure 22A:
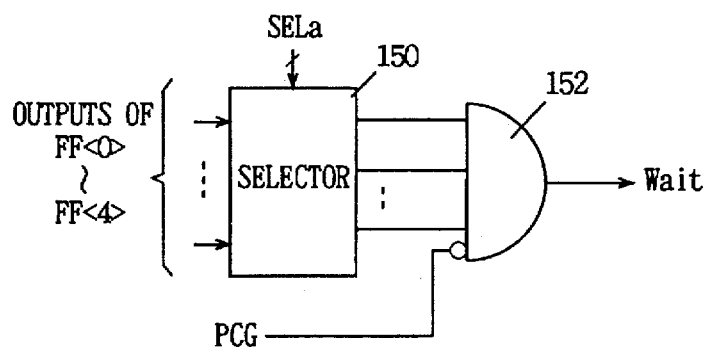
FIGS. 22A and 22B schematically show a structure for adjusting a RAS active period and a RAS precharge period, respectively.

FIG. 22A shows a modification of a wait signal Wait generation unit. Referring to FIG. 22A, a wait signal generation unit includes a selector 150 for selecting an output count bit value of counters FF <0>–FF <4> according to a select signal SELa, and gate circuit 152 for receiving a selected count value of selector 150 and a precharge signal PCG. Flip-flops FF <0>–FF <4> are an appropriate combination of D flip-flops FF <0>–FF <4> and FF2 <0>–FF2 <4> included in the Row counter. Select signal SELa supplied to selector 150 is generated according to information that determines the select state stored in the register similar to the structure of FIG. 21B. This gate circuit 152 corresponds to gate circuit 112 of FIG. 12. By adjusting the generation timing of wait signal Wait, RAS active time tRAS can be adjusted correspondingly to the frequency of the clock signal.

Figure 22B:
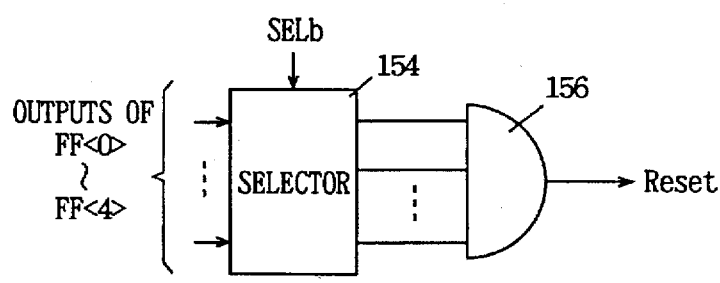

FIG. 22B shows a modification of a reset signal generation unit. Referring to FIG. 22B, a reset signal generation unit includes a selector 154 for selecting a set of output count values (bits) of D flip-flops FF <0>–FF <4> in the Row counter according to select signal SELb, and a gate circuit 156 for receiving count bits from selector 154. Gate circuit 156 corresponds to gate circuit 112 of FIG. 12. Control signal SELb applied to selector 154 is written under the control of a processor or a memory control into a register of a structure similar to that shown in FIG. 21B. By adjusting the active/inactive timing of reset signal Reset, RAS precharge time tRC can be adjusted correspondingly to a frequency of a clock signal.

By virtue of a structure where an output count bit of a counter applied to the gate circuit generating a control signal is selected according to select designating information, the generation timing (active/inactive timing) of an internal operation control signal can easily be adjusted by means of software even when the operating frequency of a clock signal is altered. The DRAM can be operated at an optimum internal operation timing.

[Self Refresh Operation]

Figure 23:
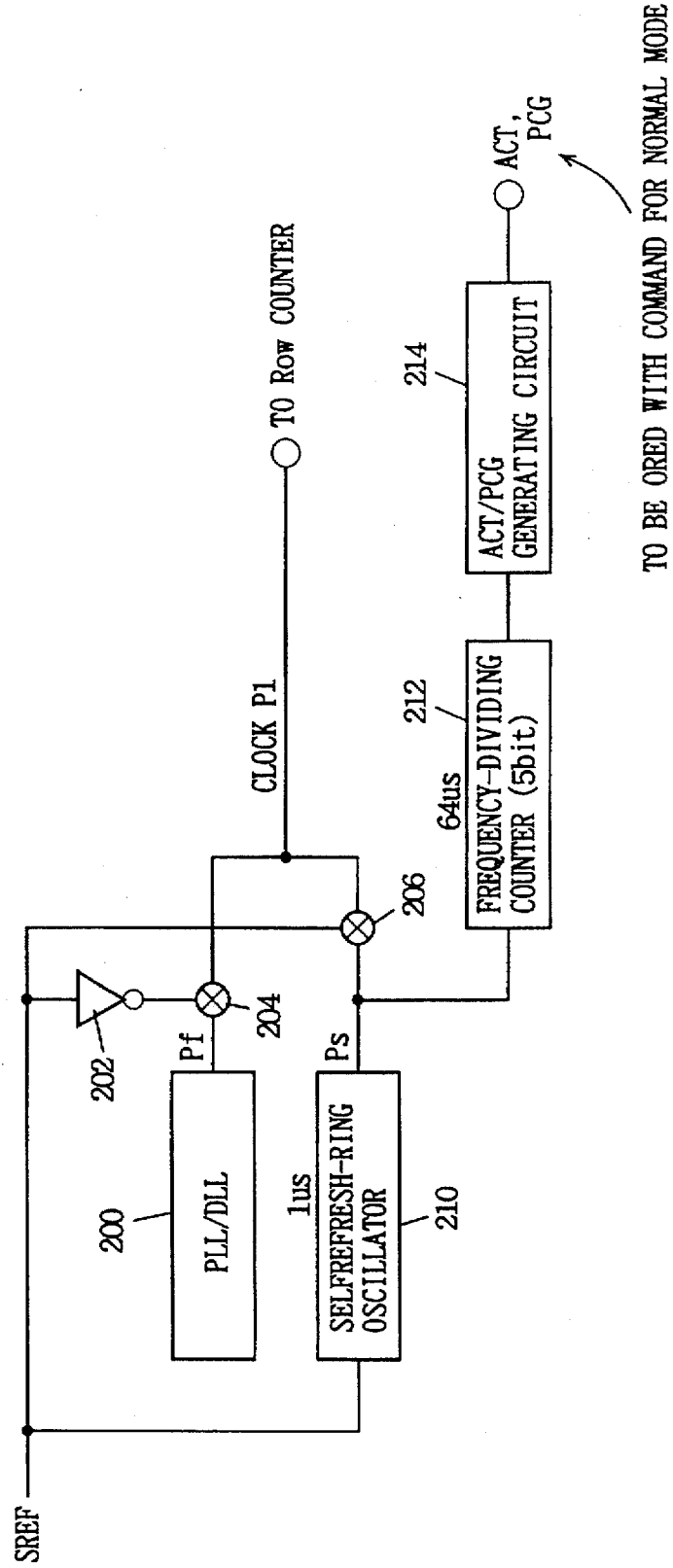
FIG. 23 schematically shows a structure of a self refresh operation control unit.

FIG. 23 schematically shows a structure of a control unit for carrying out a self refresh operation of the DRAM according to the present invention. Referring to FIG. 23, a self refresh control unit includes a ring oscillator 210 for self refresh, activated upon activation of a self refresh designating signal (self refresh command SREF) for oscillating at the cycle of 1 μs, for example, an oscillator 200 constantly operating for generating an internal clock signal in synchronization with a system clock, an inverter 202 for receiving self refresh mode designating signal SREF, a select gate 204 rendered nonconductive during inactivation of self refresh mode designating signal SREF for selecting output signal Pf of oscillator 200 and providing the same to the Row counter as clock signal P1, a select gate 206 rendered conductive during activation of self refresh mode designating signal SREF for selecting an output signal Ps of self refresh-ring oscillator 210 to apply the same to the Row counter as clock signal P1, a frequency-dividing counter 212 of 5 bits for counting output signal Ps of self refresh-ring oscillator 210, and an ACT/PCG generation circuit 214 for generating an active signal ACT and a precharge signal PCG at the time of refresh according to a count value of frequency-dividing counter 210.

Figure 24:
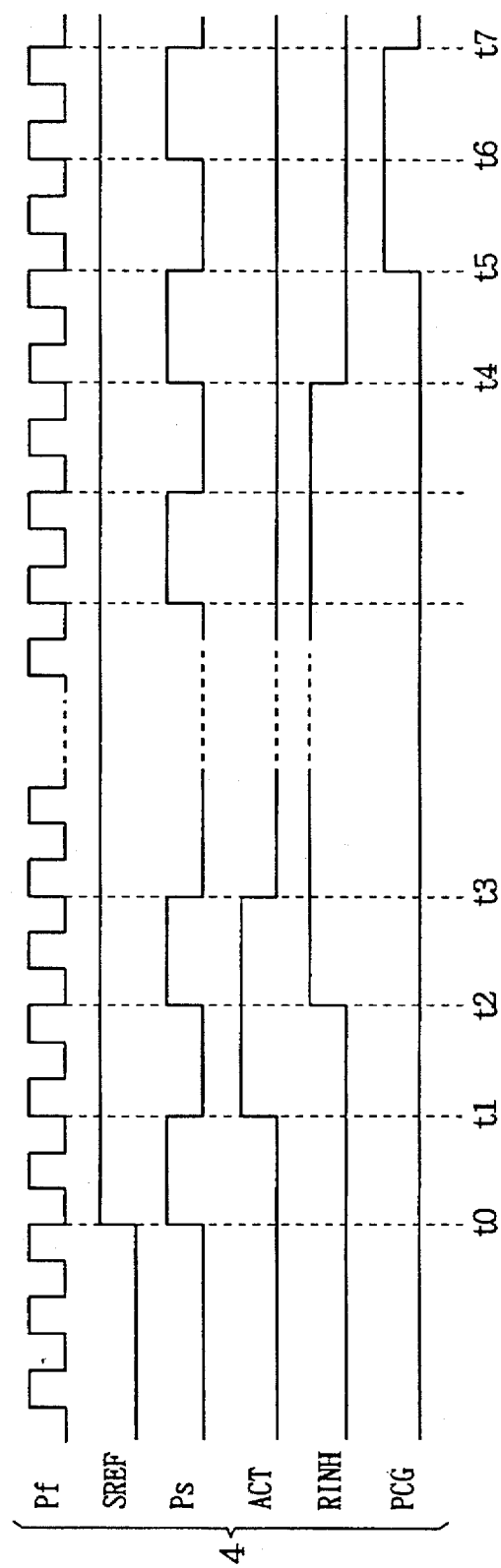
FIG. 24 is a timing chart showing an operation of the self refresh control unit of FIG. 23.

Oscillator 200 is constituted by a phase locked loop (PLL) or delayed locked loop (DLL) to effect an oscillation operation stably. Frequency-dividing counter 212 counts the output signal Ps of self refresh-ring oscillator 210, and is a 5-bit counter to frequency-divide output signal Ps of self refresh-ring oscillator 210 by a factor of 64. ACT/PCG generation circuit 214 provides an active signal ACT for refresh when the output count value of frequency-dividing counter 212 is 1, and provides a precharge signal PCG at that clock cycle when internal row related command inhibit signal RINH makes a transition from an active state to an inactive state. Signals ACT and PCG from ACT/PCG generation circuit 214 are ORed with respective commands ACT and PCG applied in a normal operation mode (normal) and then provided to the Row counter already described. The operation of the self refresh control unit of FIG. 22 will be described with reference to the timing chart of FIG. 24.

Oscillator (PLL/DLL) 200 constantly carries out an oscillation operation, and select gate 204 receives oscillation signal Pf from oscillator 200 and output the same as clock signal P1 in a normal operation mode.

At time t0, self refresh mode designating signal SREF is pulled up to an H level, whereby self refresh mode is specified. In response to activation of self refresh mode designating signal SREF, self refresh-ring oscillator 210 is activated. An oscillation operation is performed to change output signal Ps at a predetermined cycle (1 μs). Frequency-dividing counter 212 counts output signal Ps of self refresh-ring oscillator 210. At the time of reset, frequency-dividing counter 212 has its initial value reset to 0 (cancel of self refresh mode). When output signal Ps of self refresh-ring oscillator 210 rises, frequency-dividing counter 212 effects a count operation to change its count value to 1.

At time t1, active signal ACT for refresh from ACT/PCG generation circuit 214 is activated and applied to the Row counter. In this state, select gate 204 is rendered nonconductive and select gate 206 is rendered conductive. Output signal Ps from self refresh-ring oscillator 210 is applied to the Row counter as clock signal P1. At time t2, row related command inhibit signal RINH is pulled up to an H level in synchronization with a rise of clock signal Ps, whereby an internal row select operation is initiated. At time t4, row related command inhibit signal RINH is pulled down to an L level when the Row counter performs a count operation. RAS active period tRAS is defined by signal RINH attaining an H level. Therefore, at the elapse of this period, sensing, amplifying, and rewriting of the data of memory cells connected to the selected row is carried out internally.

At time t5, clock signal Ps falls, and precharge signal PCG for refresh from ACT/PCG generation circuit 214 is driven to an H level and applied to the Row counter. Thus, a refresh operation of the memory cells of the refresh row in a selected state is completed. Thereafter, a refresh operation is effected every time the count value of frequency-dividing counter 212 becomes 1, i.e. every 64 μs.

Meanwhile, it is described that active signal ACT for refresh is rendered active when the count value of frequency-dividing counter 210 is 1. This is because, when self refresh mode designating signal SREF is first applied, signal Ps output from self refresh-ring oscillator 210 rises to cause the count value of frequency-dividing counter 212 to change from 0 to 1, whereby the refresh active signal ACT is reliably generated. In a refresh operation, high speed access is not required (since data access is not carried out). Therefore, there is no problem even if the DRAM is internally operated at low speed. Furthermore, current consumption is reduced since the charging/discharging frequency is less than that of a normal operation mode due to the internal circuitry operating according to clock signal Ps of slow speed.

Figure 25A:
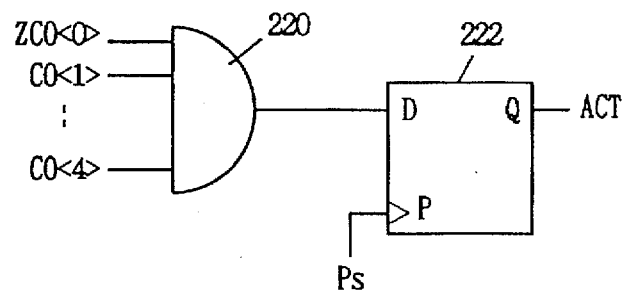
FIGS. 25A and 25B show a structure and operation, respectively, of an ACT signal generation portion of an ACT/PCG generation circuit of FIG. 23.

FIG. 25A shows a structure of an active signal ACT generation unit for a refresh operation in ACT/PCG generation circuit 214 of FIG. 23. Referring to FIG. 25A, an ACT/PCG generation circuit includes an AND circuit 220 receiving count bits ZCO <0> and CO <1>, ... CO <4> output from frequency-dividing counter 212, and a D flip-flop 220 taking in and latching the output signal of AND circuit 220 in synchronization with a fall of clock signal Ps. Refresh active signal ACT is provided from output Q of D flip-flop 220.

Figure 25B:
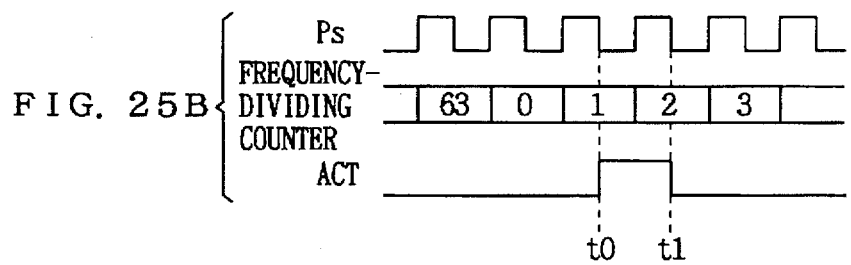

FIG. 25B is a timing chart representing the operation of the ACT generation unit of FIG. 25A. Signal Ps oscillates at a predetermined cycle (1 μs), so that frequency-dividing counter 212 has the count value changed at every rise of clock signal Ps. When frequency-dividing counter 212 has a count value of 1, the output signal of AND circuit 220 is driven to an H level. D flip-flop 220 takes in and latches the output signal of AND circuit 220 in synchronization with a fall of clock signal Ps. Therefore, active signal ACT for refresh is rendered active at an H level during time t0 to time t1.

Figure 26A:
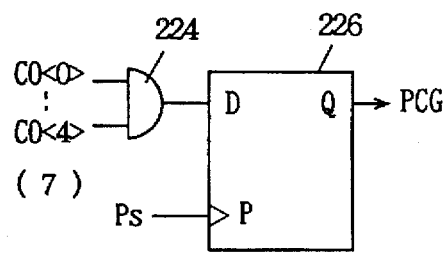
FIGS. 26A and 26B show a structure and operation, respectively, of a PCG signal generation portion of the ACT/PCT generation circuit shown in FIG. 23.
Figure 26B:
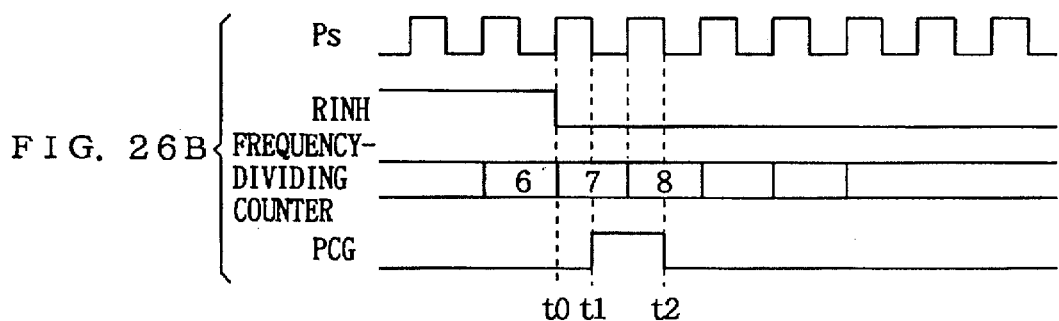

FIG. 26A shows a structure of a refresh precharge signal PCG generation unit of ACT/PCG generation circuit 214 of FIG. 23. Referring to FIG. 26A, a refresh precharge signal generation unit includes an AND circuit 224 receiving a count value of frequency-dividing counter 212, and a D flip-flop 226 taking in and latching an output signal of AND circuit 214 in synchronization with clock signal Ps. Count bits combined such that the output signal of AND circuit 224 attains an H level when the output count value of frequency-dividing counter 212 is 7 is applied to the inputs of AND circuit 224. The combination of the count bits differs depending on which of a general binary counter and a Johnson counter is used. The operation of the precharge signal generation unit of FIG. 26A will be described with reference to the timing chart of the FIG. 26B. In FIG. 26B, an active signal ACT for a refresh mode is generated when the count value of frequency-dividing counter 212 is 1. Therefore, RAS active period tRAS takes 5 clock cycles. Row related command inhibit signal RINH is rendered active at an H level when the count value of frequency-dividing counter is 2 to 6.

At time t0, row related command inhibit signal RINH is rendered inactive at an L level in synchronization with a rise of clock signal Ps. At this time t0, the count value of frequency-dividing counter 212 reaches 7, so that the output signal of AND circuit 224 is driven to an H level. At time t1, clock signal Ps is pulled down to an L level, and precharge signal PCG from D flip-flop 226 rises to an H level. At time t2, clock signal Ps falls, the count value of frequency-dividing counter 212 has changed to 8 in synchronization with a rise of clock signal Ps, and the output signal of AND circuit 224 is pulled down to an L level before time t2. Therefore, precharge signal PCG is pulled down to an L level. Thus, precharge signal PCG for a refresh operation is activated during time t1 to time t2.

Figure 27:
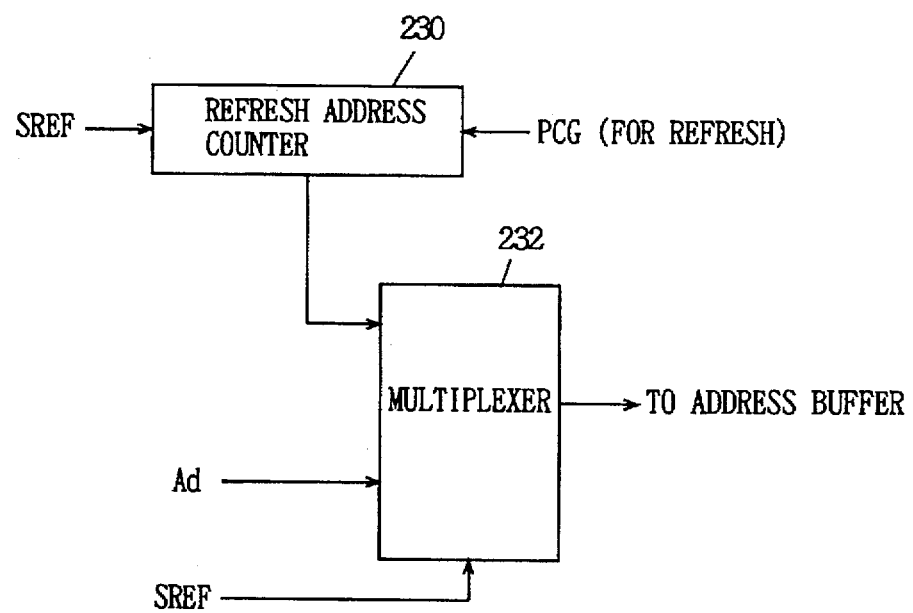
FIG. 27 schematically shows a structure of a self refresh address generation unit.

FIG. 27 schematically shows a structure of an address generation unit for a self refresh operation. Referring to FIG. 27, self refresh address generation unit includes a refresh address counter 230 rendered active during activation of a self refresh designating signal SREF for incrementing its count value when precharge signal PCG for refresh is activated, and a multiplexer 232 receiving an output count value from refresh address counter 230 and an externally applied address signal Ad (from memory controller) to select one of them according to self refresh mode self designating signal SREF and applying the selected signal to an address buffer. Multiplexer 232 selects a count value (refresh address) of refresh address counter 230 when the refresh mode designating signal SREF is active, and selects and provides to address buffer an externally address signal Ad (from memory controller) when self refresh mode designating SREF is inactive during a normal operation mode.

[Other Structures of Self Refresh Operation]

Figure 28:
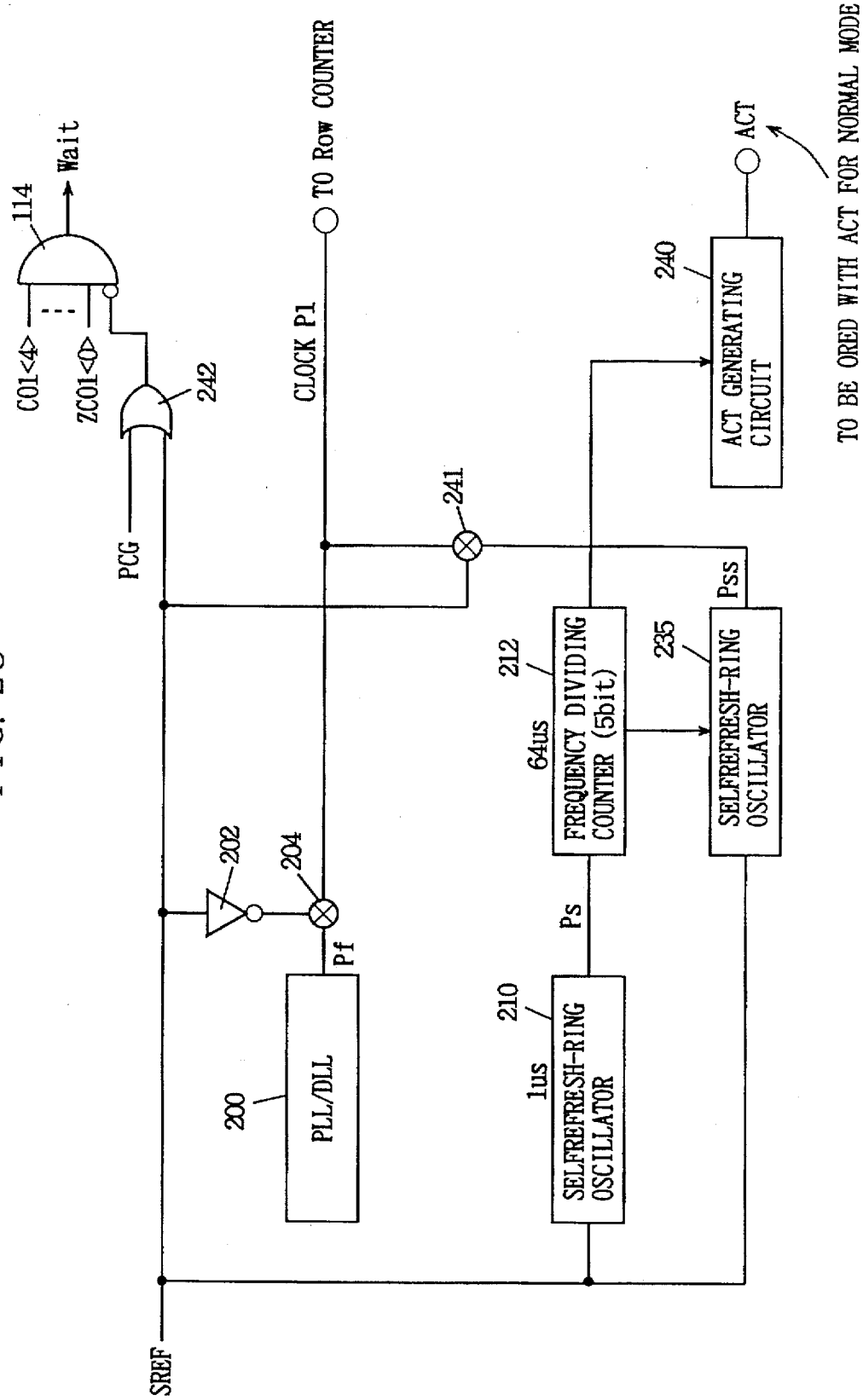
FIG. 28 shows another structure of a self refresh control unit.

FIG. 28 shows another structure of a control unit for a self refresh operation. Referring to FIG. 28, a self control unit includes an oscillator 200, an inverter 202, a select gate 204, a ring oscillator 210 for self refresh, a frequency-dividing counter 212, a self refresh-ring oscillator 235 activated to do an oscillation operation only when the count value of frequency-dividing counter 212 is 0 (or 1), a select gate 241 rendered conductive upon activation of self refresh mode designating signal SREF to select a signal Pss output from self refresh-ring oscillator 235 to provide the same to the Row counter as clock signal P1, and an ACT generation circuit 240 for generating a one shot pulse signal when the count value of frequency-dividing counter 212 is 0 (or 1) to output the same as a refresh active signal ACT. Self refresh-ring oscillator 235 does an oscillation operation at the frequency of, for example, 10 ns or 100 ns, or a frequency therebetween. The oscillation period of self refresh-ring oscillator 235 is 1 μs which is the oscillation cycle of self refresh-ring oscillator 210 since the oscillation operation is effected only when the count value of frequency-dividing counter 212 is 0 or 1.

The self refresh control unit further includes an OR gate 242 for receiving self refresh mode designating signal SREF and precharge signal PCG applied in a normal operation mode, and a gate circuit 114 for receiving an output signal of OR gate 242 and output count bits CO1 <4>–CO1 <1> and ZCO1 <0> of the Row counter (Johnson counter). Wait signal Wait is output from gate circuit 114. Gate circuit 114 corresponds to gate circuit 114 shown in FIG. 12.

Figure 29A:
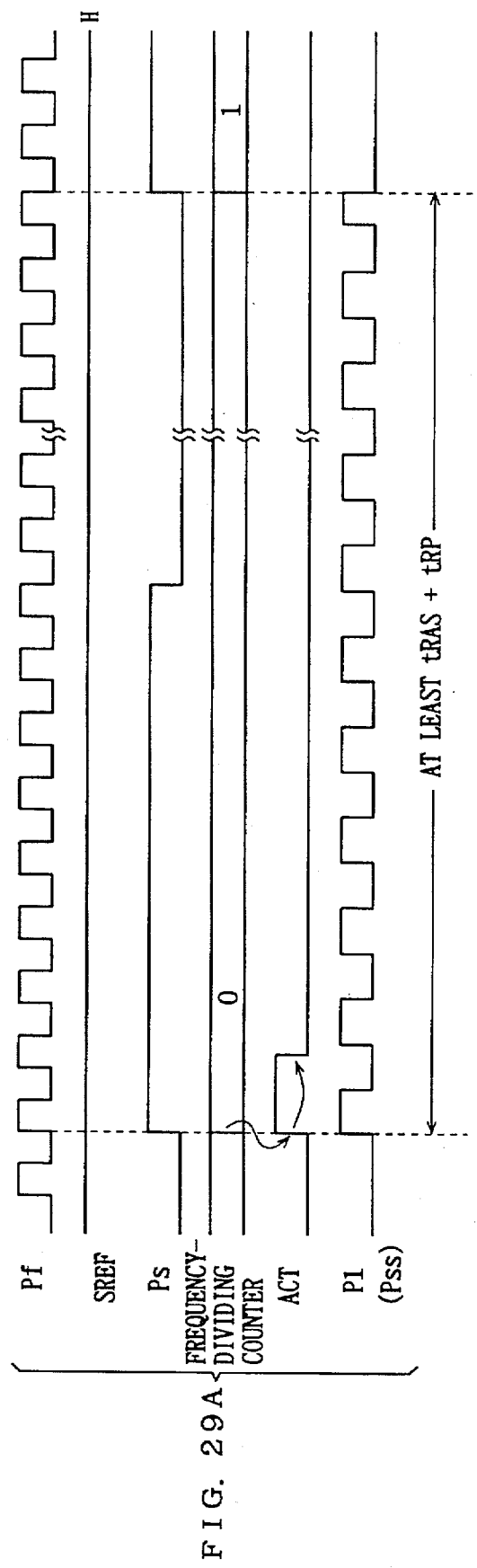
FIG. 29A is a timing chart showing an operation of the control unit of FIG. 28, and FIGS. 29B and 29C show examples of a structure of a ring oscillator for self refresh shown in FIG. 28.

In a self refresh operation mode, self refresh mode designating signal SREF attains an H level, and the output signal of OR circuit 242 attains an H level. Therefore, wait signal Wait remains at the L level constantly. The Johnson type Row counter sequentially effects a count operation without waiting. When active signal ACT is applied in a refresh operation, the count value of the Row counter is sequentially incremented. An internal control signal is generated for automatically effecting row selection and de-selection (active/inactive). By maintaining wait signal Wait constantly in an inactive state using the Johnson type counter, it is not necessary to generate a precharge signal PCG in a refresh operation mode. An operation of the structure shown in FIG. 28 will be described with reference to the waveform diagram of FIG. 29A. In FIG. 29A, active signal ACT for a refresh operation is generated when the count value of frequency-dividing counter 212 is 0.

In FIG. 29A, self refresh mode designating signal SREF is already maintained at an H level. Under this state, select gate 204 attains an non-conductive state, and signal Ps output from oscillator 200 is not transmitted. Frequency-dividing counter 212 performs a count operation according to signal Ps output from self refresh ring oscillator 210. When the count value of frequency-dividing counter 212 becomes 0, Self refresh ring oscillator 235 is activated to effect an oscillation operation. Oscillation signal Pss from ring oscillator 235 is applied to the Row counter as clock signal P1.

In response to the count value of frequency-dividing counter 212 changing to 0, ACT generation circuit 240 generates a one shot pulse signal to provide the same to the Row counter as active signal ACT for a refresh operation. As a result, the Row counter is started, whereby an internal count operation is effected to sequentially output a control signal. During this period, a control signal is generated to effect a row select operation and sensing, amplifying and rewriting operation of data of the memory cells connected to the selected row according to clock signal Pss output from ring oscillator 235.

When the count value of frequency-dividing counter 212 changes to 1, self refresh-ring oscillator 235 ceases its oscillation operation. The Row counter has already completed its count operation and the word line select operation and the sensing, amplifying, rewriting operation of a memory cell, has already ended. In response to the cessation of the oscillation operation of ring-oscillator 235, the count operation of the Row counter is also ceased. When the count value of frequency-dividing counter 212 returns to 0, ACT generation circuit 240 provides a active signal ACT for a refresh operation. When the Row counter has its count value reset, its initial state is maintained until the next active signal ACT is applied (refer to FIG. 13). Therefore, a refresh operation is reliably carried out every 64 μs.

Figure 29C:
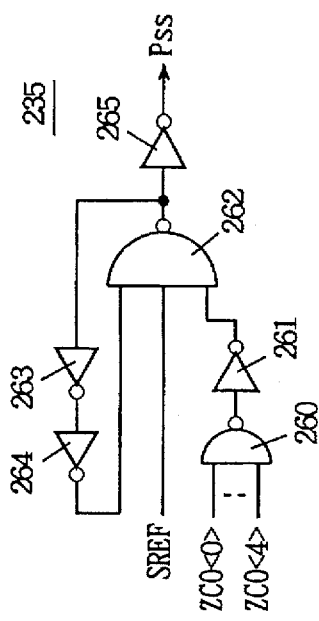
Figure 29B:
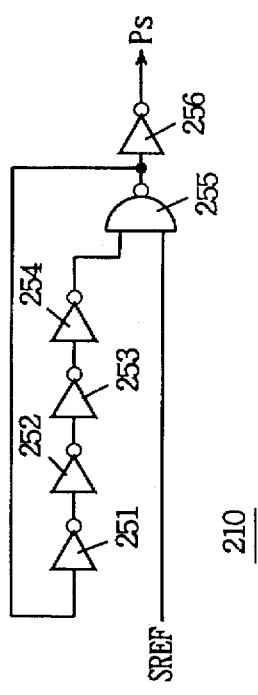

FIG. 29B shows an example of a structure of self-refresh-ring oscillator 210 of FIG. 28. Referring to FIG. 29B, self refresh-ring oscillator 210 includes four stages of cascaded inverters 251–254, an NAND circuit 255 receiving an output signal of inverter 254 and self refresh mode designating signal SREF, and an inverter 256 for receiving an output signal of NAND 255. The output signal of NAND 255 is applied to the input of inverter 251. Signal Ps is output from inverter 256. When self refresh mode designating signal SREF attains an L level, the output signal of NAND circuit 255 is fixed at the H level. Therefore, signal Ps is constantly fixed at the L level. When self refresh mode designating signal SREF is driven to an H level, NAND circuit 255 functions as an inverter. Self refresh-ring oscillator 210 is rendered active to operate as a ring oscillator constituted by 5 stages of inverters. An oscillation operation at a predetermined cycle (1 μs) is effected.

FIG. 29C shows an example of a structure of self refresh-ring oscillator 235 shown in FIG. 28. Referring to FIG. 29C, self refresh-ring oscillator 235 includes an NAND circuit 260 receiving complementary output count bits ZCO <0>–ZCO <4> of frequency-dividing counter 212, an inverter 261 receiving an output signal of NAND circuit 260, an NAND circuit 262 receiving an output signal of inverter 261, self refresh mode designating signal SREF, and an output signal of inverter 264, and inverters 263, 264, and 265. Inverter 263 receives an output signal of NAND circuit 262. Inverter 264 receives an output signal of inverter 263. Inverter 265 receives an output signal of NAND circuit 262 to provide an oscillation signal Pss.

When all the count bits of frequency-dividing counter 212 are 0 in the structure of FIG. 29C, the output signal of NAND circuit 260 attains an L level, which causes the output signal of inverter 261 to be pulled up to an H level. Self refresh mode designating signal SERF attains an H level. Therefore, NAND circuit 262 operates as an inverter, and self refresh-ring oscillator 235 operates as a ring-oscillator of three stages of inverters during this period (during the period where the count value of frequency-dividing counter 212 is 0). When self refresh mode designating signal SREF attains an L level, the output signal of NAND circuit 262 attains an H level, and signal Pss is fixed to an L level constantly.

In the structure of a refresh address generation unit, refresh address counter 230 of FIG. 27 is implemented such that the count value thereof is incremented according to reset signal Reset output from the Row counter.

ACT generation circuit 240 is formed of a normal one-shot pulse generation circuit. A structure may be employed where self refresh-ring oscillator 235 is rendered active only when the count value of frequency-dividing counter 212 is 1, not 0.

By effecting a self refresh operation according to a clock signal of a relatively high speed (slower than in a normal operation) in a self refresh operation mode, the time period staring from a selected state of a word line until an active state of a sense amplifier can be reduced to suppress the possibility of a small readout voltage prior to a sensing operation from being altered due to noise or the like. Therefore, a refresh operation can be carried out accurately.

By generating a refresh designating signal in synchronization with a clock signal in a self refresh mode, a refresh operation can be effected at an accurate timing without being influenced by the operation environment.

[Other Structures]

The above embodiments were described in which the internal operations of the DRAM are all carried out in synchronization with a clock signal in a DRAM-incorporating processor. However, the present invention is applicable to discrete memory as long as the DRAM operates in synchronization with a clock signal.

According to the present invention, the internal operations of the DRAM are all carried in synchronization with a clock signal, a DRAM that operates accurately at high speed can be realized without taking into consideration the timing margin of an internal control signal. Furthermore, by virtue of a structure of providing an access operation inhibit signal from the DRAM to the memory controller, the control load of the memory controller is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous type semiconductor memory device including a memory array of memory cells arranged in rows and columns and operating in synchronization with a periodically applied clock signal, comprising:

counter means started in response to an operation mode designating signal for counting the clock signal, and control signal generating means for generating an internal operation control signal controlling at least one of activation and inactivation of an operation associated with a row or column selection and designated by said operation mode designating signal according to a count value from said counter means.

2. The synchronous type semiconductor memory device according to claim 1, wherein said counter means comprises counter circuit means for counting two phase, non-overlapping clock signals generated from said clock signal.

3. The synchronous type semiconductor memory device according to claim 2, wherein said counter circuit means comprises a Johnson counter started in response to said operation mode designating signal for counting one of said two phase, non-overlapping clock signals, and latch means for taking in and latching a count value output from said Johnson counter in synchronization with other of said two phase, non-overlapping clock signals, and providing said latched count value to said control signal generation means.

4. The synchronous type semiconductor memory device according to claim 1, wherein said counter means comprises a counter circuit activated when said operation mode designating signal designates a row select operation of said memory array to initiate a count operation, inhibit means for inhibiting a count operation of said counter circuit when the count value from said counter circuit arrives at a first predetermined value, means for inactivating said inhibit means to resume a count operation of said counter circuit when said operation mode designating signal designates inactivation of a row select operation of said memory array, and means for resetting a count value of said counter circuit when the count value from said counter circuit arrives at a second predetermined value.

5. The synchronous type semiconductor memory device according to claim 1, further comprising:

means for providing a row inhibit signal outside of said memory device to inhibit input of a row related operation mode designating signal associated with a row select operation until the count value from said counter means reaches a first predetermined value, and means for providing outside of said memory device a column inhibit signal to inhibit input of a column related operation mode designating signal associated with a column select operation of said memory array until the count value from said counter means reaches a second predetermined value, said operation mode designating signal including said row related operation mode designating signal and said column related operation mode designating signal.

6. The synchronous type semiconductor memory device according to claim 5, wherein said counter means comprises a column counter started when said operation mode designating signal designates an operation associated with a column selection of said memory array for counting said clock signal, and said synchronous type semiconductor memory device further comprising means for providing outside of said memory device a signal indicating completion of an operation associated with said column selection when the count value of said column counter arrives at a third predetermined value.

7. The synchronous type semiconductor memory device according to claim 1, wherein said counter means provides a multi-bit count value as said count value, and wherein said control signal generation means comprises logic means for performing a logic operation on a predetermined set of output count bits of said multi-bit count value, said counter means to generate a corresponding internal operation control signal related to the predetermined set as said internal operation control signal, wherein logic of said logic operation is determined according to a logic designating signal.

8. The synchronous semiconductor memory device according to claim 1, wherein said counter means outputs a multi-bit count, wherein said control signal generation means comprises a selector for selecting one of a plurality of sets of count bits of said multi-bit count value from said counter means in response to a select signal, and logic means for generating a corresponding internal operation control signal as said internal operation control signal according to a set of count bits selected by said selector, said corresponding internal operation control signal being predeterminedly related to said set of count bits.

9. The synchronous type semiconductor memory device according to claim 6, wherein said signal indicating completion of column selection indicates that valid data is output outside said memory device.

10. The synchronous type semiconductor memory device according to claim 1, further comprising:

refresh oscillation means activated in response to activation of a self refresh designating signal designating refresh of data held in the memory cell, for effecting an oscillation operation at a predetermined cycle, select means receiving said clock signal and an output signal of said refresh oscillation means, responsive to activation of said self refresh designating signal for selecting and providing to said counter means the output signal of said refresh oscillation means, frequency-dividing count means for counting the output signal of said refresh oscillation means, and frequency-dividing an output signal of said refresh oscillation means, and means for supplying as said operation mode designating signal to said counter means a signal designating activation of a row select operation of said memory array according to a count value of said frequency-dividing count means.

11. The synchronous type semiconductor memory device according to claim 10, further comprising:

high speed oscillation means receiving said self refresh designating signal and the output count value of said frequency-dividing count means, responsive to activation of said self refresh designating signal to be activated for a predetermined time period according to the output count value of said frequency-dividing count means for effecting an oscillation operation at a speed higher than the speed of said refresh oscillation means, and means responsive to said self refresh designating signal for selecting and providing to said counter means an output signal of said high speed oscillation means instead of the output signal of said refresh oscillation means.

* * * * *

UNITED STATES PATENT AND TRADEMARK OFFICE
CERTIFICATE OF CORRECTION

PATENT NO. : 5,751,655
DATED : May 12, 1998
INVENTOR(S) : Akira YAMAZAKI et al.

It is certified that error appears in the above-identified patent and that said Letters Patent is hereby corrected as shown below:

Claim 7, line 3, after "value" (first occurrence) insert --of plural count bits--;
        line 4, change "generation" to --generating--;
        line 6, delete "output";
        line 7, change "to generate" to --including means for generating--.
    Claim 8, line 3, after "count" insert --value--;
        line 4, change "generation" to --generating--.
    Claim 10, line 14, change "an" to --the--.
    Claim 11, line 16, after "means" insert --as the clock signal--.

Signed and Sealed this

Twenty-ninth Day of December, 1998

Attest:

BRUCE LEHMAN

*Attesting Officer*      *Commissioner of Patents and Trademarks*